United States Patent [19]

Seki et al.

[11] Patent Number: 4,867,837
[45] Date of Patent: Sep. 19, 1989

[54] FILM PEELER

[75] Inventors: Mitsuhiro Seki, Tokyo; Sigeo Sumi, Saitama; Fumio Hamamura, Kanagawa, all of Japan

[73] Assignee: Somar Corporation, Tokyo, Japan

[21] Appl. No.: 122,734

[22] Filed: Nov. 18, 1987

[30] Foreign Application Priority Data

Nov. 18, 1986 [JP] Japan ................. 61-274922
Nov. 26, 1986 [JP] Japan ................. 61-280999
Dec. 12, 1986 [JP] Japan ................. 61-296246
Dec. 12, 1986 [JP] Japan ................. 61-296247

[51] Int. Cl.$^4$ ............................................. B32B 31/18
[52] U.S. Cl. ................................. 156/584; 156/344
[58] Field of Search ............. 156/344, 584; 271/97, 271/280

[56] References Cited

U.S. PATENT DOCUMENTS 4,724,032  2/1988  Kay ..................................... 156/344

Primary Examiner—Robert A. Dawson
Attorney, Agent, or Firm—Sughrue, Mion, Zinn, Macpeak & Seas

[57] ABSTRACT

A film peeler for peeling off a film sticking to a base is used to peel off part of the film sticking to the base, to make that part of the film thus peeled off adhere to a peel direction setting plate and to discharge the film with a film carrying device. The face of the peel direction setting plate where film adheres is formed with a conductive member. The conductive member is provided on an insulating material.

28 Claims, 14 Drawing Sheets

FILM PEELER

BACKGROUND OF THE INVENTION

The present invention relates to a film peeling technique, and more particularly to a technique which can be employed effectively to peel off a film sticking to a base.

In printed wiring boards for use in electronic equipment such as computers, a wiring having a prescribed pattern is formed of copper on one or both sides of an insulating base.

A printed wiring board of that sort can be manufactured through the following steps. First, a laminate consisting of a photosensitive resin (photoresist) layer and a translucent resin film (cover film) for protecting the photosensitive resin layer is formed by thermocompression bonding on a conductive layer of an insulating base. Thereafter, a wiring pattern film is laid over the laminate thus formed and the photosensitive resin layer is exposed to light through the wiring pattern film and the translucent resin film for a predetermined length of time. The translucent resin film is then peeled off and the photosensitive resin layer thus exposed is developed to form an etching mask pattern. The unnecessary parts of the conductive layer are removed by etching so as to obtain a printed wiring board having a desired wiring pattern.

In the aforesaid process of making a printed wiring board, there is a step required for peeling off the translucent resin film when the photosensitive resin layer thus exposed is developed. At that stage, manual labor is relied upon to peel off the translucent resin film because the film is extremely thin, where the problem is that not only deft fingers but also a great deal of skill are essential to preventing the photosensitive resin layer from being damaged or destroyed because of the deflection of the peel stress and the like.

The additional disadvantage is that workhours needed for manufacturing such a printed wiring board are on the increase because it is time-consuming to peel off the translucent resin film.

Thereupon, an automatic film peeler has been developed for automatically mechanically peeling off such a translucent resin film.

The automatic film peeler is designed to peel off the translucent resin film by uptearing part of the translucent resin film of the laminate sticking to the base by means of a needle, brush, knurl roll or the like and sending a jet of fluid to the part thus lifted. A film uptearing device for uptearing part of the laminate and a fluid injection device for sending a jet of fluid to the part thus lifted are installed close to the base carrying pathway of the automatic film peeler.

However, since the automatic film peeler is fitted with the film uptearing device and the fluid injection device close to the base carrying pathway, no drive rollers for carrying the base can be installed in that area. For this reason, the front end of the base hangs down by its own weight in that area when the thin base is carried, causing the base to deviate from the base carrying pathway or jam therein. As a result, the base and the automatic film peeler may be broken and damaged.

OBJECTS AND SUMMARY OF THE INVENTION

An object of the invention is to provide a technique of firmly holding a base being carried within a base carrying pathway in the proximity of a film uptearing device of a film peeler.

Another object of the present invention is to provide a technique of accomplishing the above object by preventing a base and a film peeler from being broken or damaged.

The above and other objects of the present invention and novel features thereof will become more apparent upon a reading of the following description in conjunction with the accompanying drawings.

A description will subsequently be given outlining the construction of a typical film peeler embodying the present invention.

The film peeler for peeling off a film sticking to a base according to the present invention is characterized in that a film uptearing device having an uptearing member for uptearing one end of the film is installed close to a base carrying pathway and base holding members for holding the base within the base carrying pathway are installed close to the uptearing member.

Particularly when a thin base is carried according to the present invention, the base is firmly held within the base carrying pathway so that the front end of the base is prevented from hanging down by its own weight and, since the base is firmly held within the base carrying pathway, the base is prevented from jamming up while being carried and the base and the film peeler are prevented from being broken or damaged.

Also, the cover film peeled off with the aid of a jet of fluid is caused to adhere to the peel direction setting plate and then a film carrying device is employed to peel off and carry the film sticking to the base. The film carrying device is connected to or built in an automatic film peeler and composed of carrying belts. The cover film carried by the film carrying device is discharged into a container for containing the discharged film.

However, the cover film thus peeled off does not always adhere to the peel direction setting plate with satisfactory adhesion. For this reason, the cover film thus peeled off may not be held between the carrying belts of the film carrying device. Therefore, the cover film sticking to the base cannot be discharged while it is being peeled off.

Although an optical sensor is employed to detect whether the cover film has been peeled off during the process of peeling off the film, it does not always attach to the peel direction setting plate with satisfactory adhesion as described above and the use of only the optical sensor is still insufficient to detect whether the cover film has been peeled off. In addition, the optical sensor may output a signal indicating that the cover film was left unpeeled, thus not causing the carrying belts not to start. Otherwise, the carrying belts may fail to hold the cover film when it has been detached from the peel direction setting plate.

Another object of the present invention is to provide a technique effective in making a film peeled off from a base adhere to a peel direction setting plate of a film peeler.

Still another object of the present invention is to accomplish the aforesaid object by providing a technique effective in reducing the percentage of rejects by ensuring that a film sticking to a base is peeled off.

A further object of the present invention is to accomplish the aforesaid object by providing a technique effective in detecting a defective base.

A still further object of the present invention is to accomplish the aforesaid object by providing a technique effective in improving a yield.

A film peeler for peeling off a film sticking to a base by peeling off part of the film sticking to the base, making that part of the film thus peeled off adhere to a peel direction setting plate and discharging the film with a film carrying device according to the present invention is characterized in that the face of the peel direction setting plate where the film adheres is formed from a conductive member and the conductive member is provided on an insulating material.

The film peeler constructed as described above is further characterized in that film attaching holes passed through the conductive member and the peel direction setting plate are provided and that an attaching device for attaching the film peeled off from the base is coupled to the film attaching holes.

The film peeler constructed as described above is further characterized in that a detector for detecting the peeled-off state of the film by means of the attaching pressure of the attaching device is provided in the pathway connecting the film attaching holes and the attaching device.

The Coulomb force resulting from the electrostatic capacitance acts on the face of the peel direction setting plate where a film adheres and the film peeled off from the base to ensure that the film is held on the peel direction setting plate. The film sticking to the base can effectively be peeled off and therefore the production of defective bases is prevented.

Moreover, the sucking force for attaching the film to the attaching face of the film peel direction setting plate acts through the film attaching holes to ensure that the film is held on the peel direction setting plate.

Changes in the attaching pressure in the pathway between the film attaching holes and the attaching device are detected to check whether or not the film has been peeled off.

DESCRIPTION OF THE PREFERRED EMBODIMENTS

Figure 1:
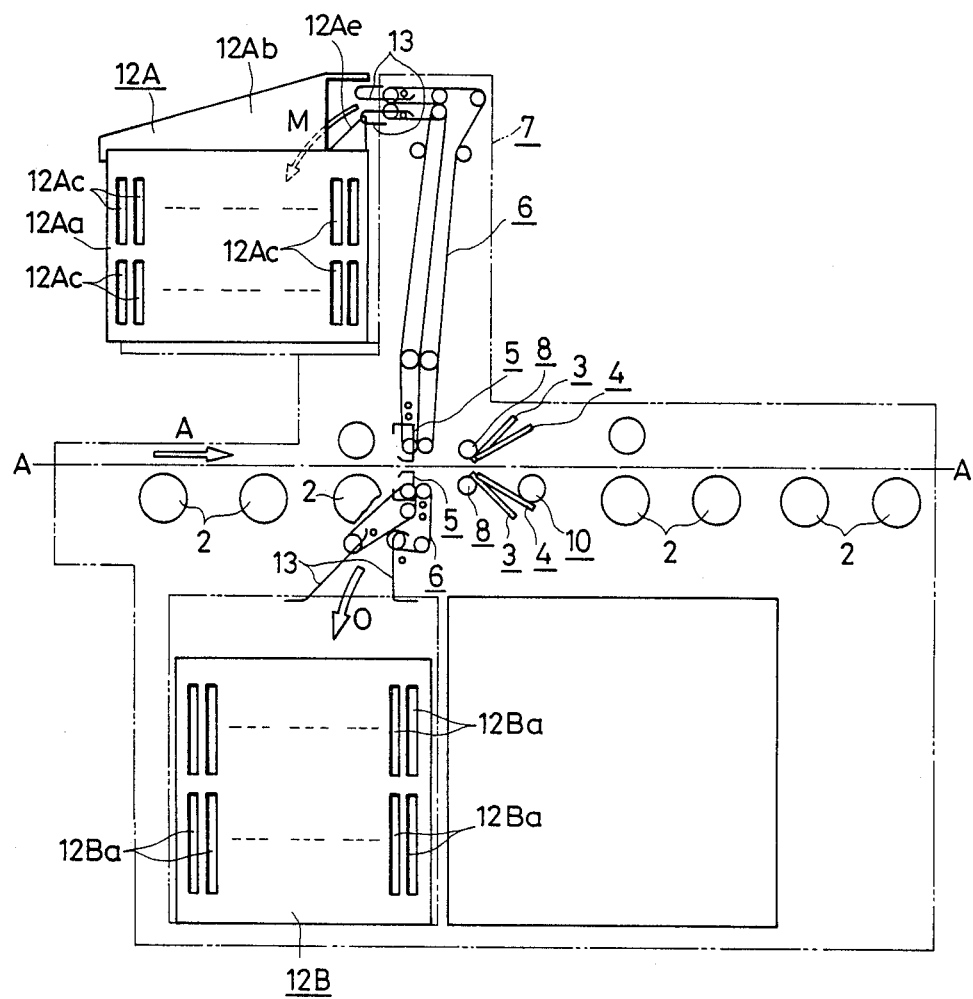
FIG. 1 is a side view showing the outline construction of a film peeler embodying the present invention for peeling off a cover film sticking to a printed wiring board.

Referring to the accompanying drawings, a description will subsequently be given of an embodiment of the present invention applied to a film peeler for peeling off a cover film sticking to a printed wiring board.

In all the drawings for illustrating the embodiment thereof, like reference characters are given to parts having like functions and the repetitive description of them will be omitted.

Figure 2:
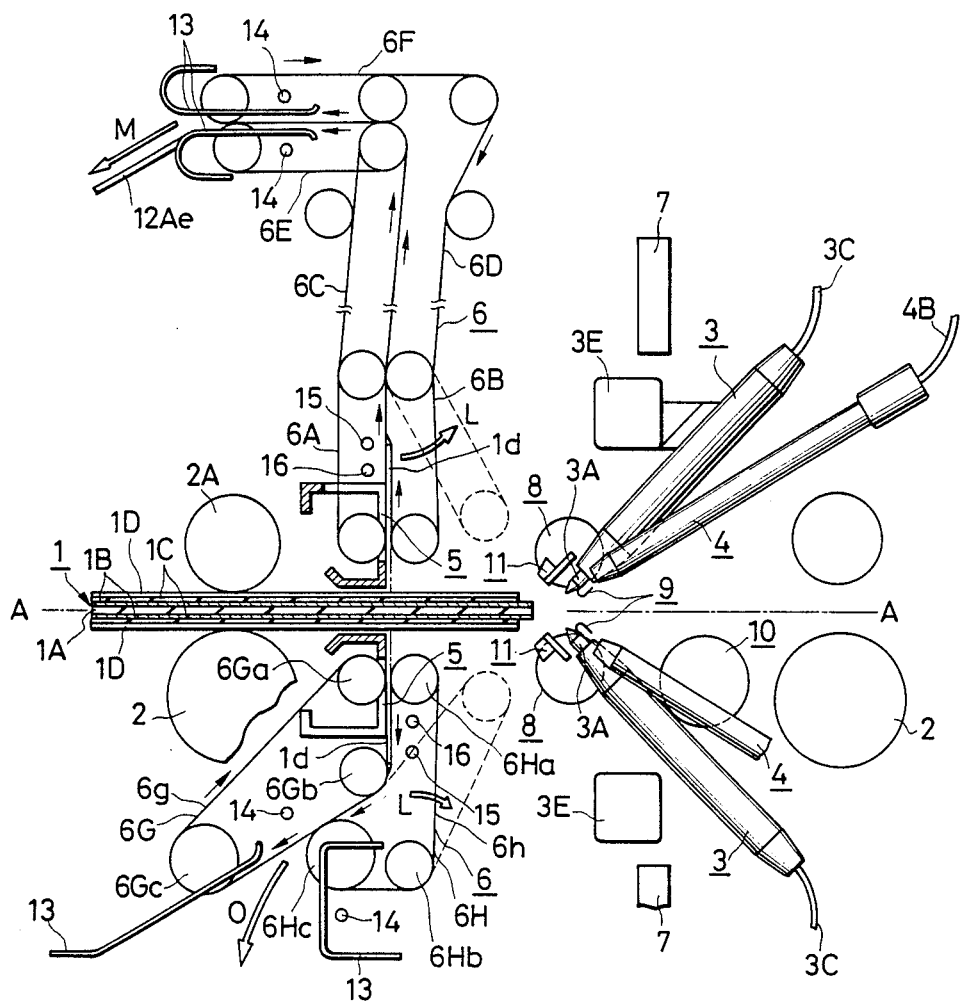
FIG. 2 is an enlarged side view of the principal part of FIG. 1.

FIG. 1 is a side view showing the outline construction of a film peeler for peeling off a cover film sticking to a printed wiring board according to the present invention. FIG. 2 is an enlarged side view of the principal part of FIG. 1.

A mechanism for carrying a printed wiring board in the film peeler for peeling off the cover film in this embodiment consists, as shown in FIGS. 1 and 2, of mainly drive rollers 2 for carrying a printed wiring board 1.

Along the base carrying pathway A—A in the carrying mechanism, there are installed film uptearing devices 3, fluid injection devices 4, peel direction setting plates (auxiliary peeling plates) 5 and film carrying devices (film discharge devices) 6.

As shown in FIG. 2, the printed wiring board 1 is provided with a conductive layer 1B of copper formed on both sides (or one side) of an insulating base 1A. A laminate consisting of a photosensitive resin layer 1C and a translucent resin film (cover film) 1D is formed by thermocompression bonding on each conductive layer 1B of the printed wiring board 1. The photosensitive resin layer 1C is in such a state that a predetermined wiring pattern has been superposed and exposed to light. The printed wiring board 1 is adapted to being moved by the carrying drive rollers 2 in direction of arrow A shown in FIG. 1.

Figure 3:
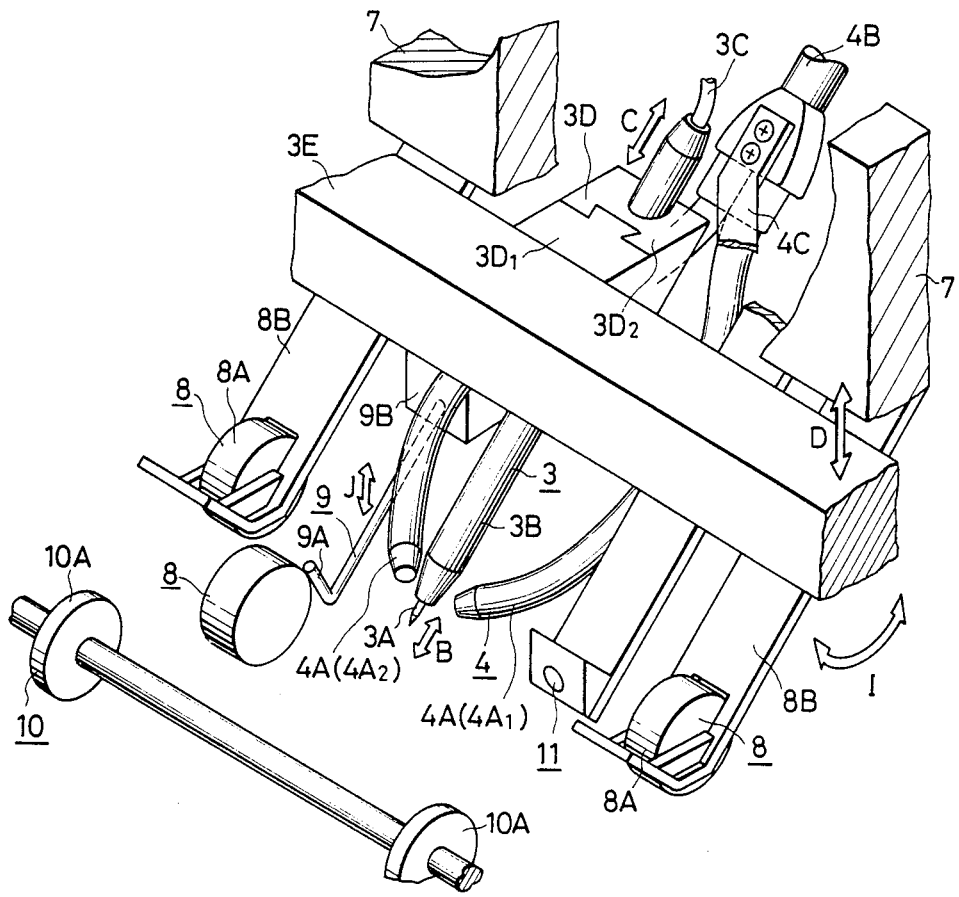
FIG. 3 is an enlarged perspective view of the principal part of FIG. 1.
Figure 4:
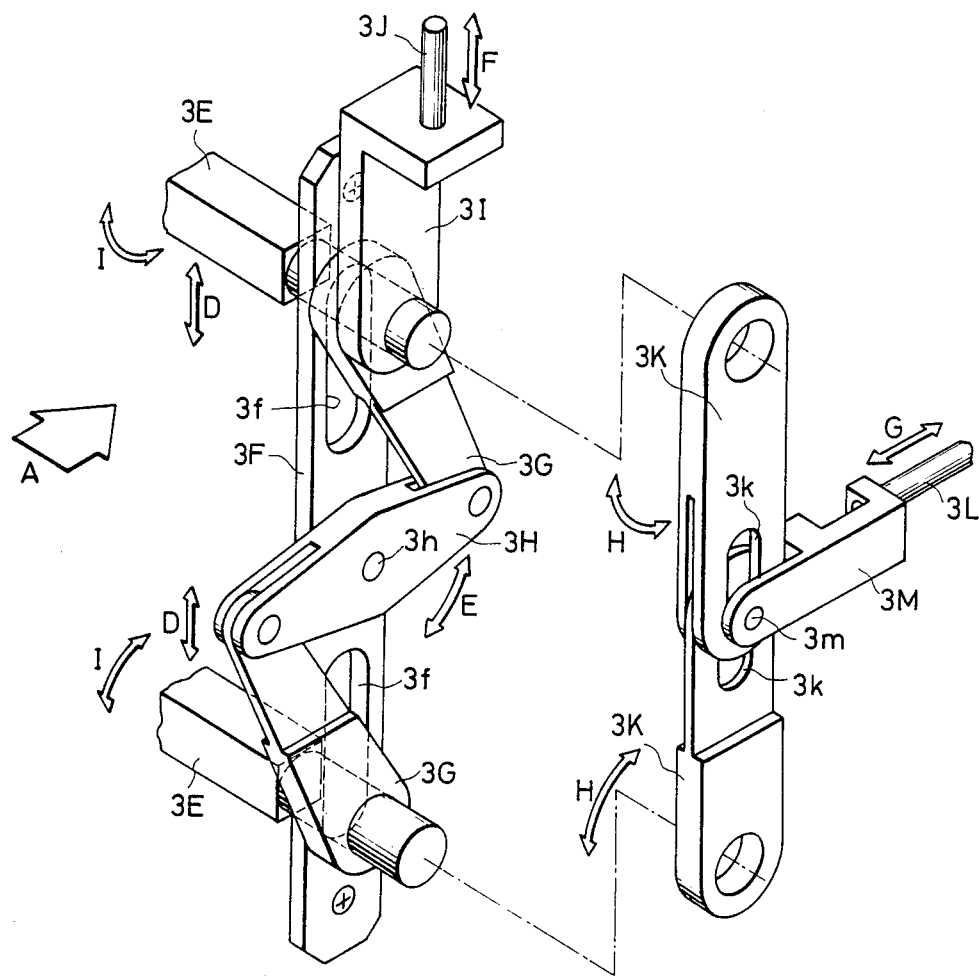
FIG. 4 is an enlarged perspective view of FIG. 1.

Each film uptearing device 3 is so constructed as shown in FIG. 3 (perspective view of the principal part) and FIG. 4 (enlarged exploded perspective view).

Each film uptearing device 3 is equipped with at least one uptearing member 3A, which is provided on both sides of the printed wiring board 1. As shown in FIG. 3, the tip of the uptearing member 3A on the printed wiring board side is in the form of a needle. The uptearing member 3A device is also vibrated by an air-operated vibration device 3B in direction of arrow B. The air pressurized by a fluid supply pipe 3C is supplied to the air-operated vibration device 3B, the detailed description of which will be omitted, so that vibrations of 200–300 strokes per minute are given to the uptearing member 3A.

The tip of the uptearing member 3A is energized to vibrate and lift up the end of the laminate consisting of the photosensitive resin layer 1C and the translucent resin film 1D. The end of the laminate thus energized causes the translucent resin film 1D to peel off from the photosensitive resin layer 1C. At the end of the laminate thus energized, the photosensitive resin layer 1C and the conductor layer 1B will not peel off from each other because the adhesion therebetween is stronger than that between the photosensitive resin layer 1C and the translucent resin film 1D.

The tip angle of the uptearing member is set at, e.g., 60-70 degrees. The tip of the uptearing member 3A is given a suitable curvature radius so that it may not damage the conductive layer 1B and the laminate of the printed wiring board 1. The uptearing member 3A is also made of a metal such as stainless or carbon steel or a nonmetal material such as ceramics to minimize the wear of the tip.

The opposite uptearing members 3A (actually the air-operated vibration devices 3B) vertically disposed close to and centered on the base carrying pathway A—A are supported through holders 3D by individual rotary shafts 3E for supporting the uptearing members 3A, respectively. The holder 3D consists of a fixed holder $3D_1$, and a slide holder $3D_2$. The fixed holder $3D_1$, is secured to a rotary shaft 3E for supporting the uptearing member, whereas the slide holder $3D_2$ is used to hold the uptearing member 3A (air-operated vibration device 3B) at a predetermined angle with respect to the base carrying pathway A—A. Moreover, the slide holder $3D_2$ is allowed to slide in direction of arrow C with respect to the fixed holder $3D_1$ (or rotary shaft 3E for supporting the uptearing member) in order that it can have the uptearing member 3A abut against the laminate at a predetermined pressure. The sliding of the slide holder $3D_2$ (not shown) in direction of arrow C is controlled by, E.G., an elastic member such as a spring.

As shown in FIG. 4, one end (or both ends) of the rotary shaft 3E for supporting the uptearing member is rotatably coupled through a guide slit $3f$ of a guide member 3F to one end of a moving arm member 3G. The guide member 3F (not shown) is fastened to the film peeler proper (7) with fitting means such as a machine screw. The guide slit $3f$ is used to guide and move each rotary shaft 3E, i.e., the uptearing member 3A closer to or away from the printed circuit board 1 (i.e., in the direction of arrow D).

The other ends of the upper and lower moving arm members 3G are respectively rotatably fitted to the opposite ends of a rotary arm member 3H rotatably fitted on the rotary shaft $3h$ in the direction of arrow E. The rotary arm member 3H is used to move the upper and lower moving arm members 3G in the opposite directions of arrow D. The shaft 3J of a double-sided driving source is connected through a coupling arm member 3I to one end of the rotary shaft 3E for supporting the upper (or lower) uptearing member.

The guide member 3F for guiding the rotary shafts 3E for supporting the uptearing members, the moving arm members 3G, the rotary arm members 3H and the double-sided driving source constitute a link mechanism for the film uptearing devices 3 for moving the uptearing members 3A installed on both sides of the printed circuit board closer to and away from each other by the operation of the shaft 3J in the direction of arrow F. Each of the members constituting the link mechanism is made of a material relatively hardly deformable against external force such as iron, aluminum alloy or hard plastics. As for the double-sided driving source, use can be made of an air-pressure cylinder, hydraulic cylinder or electromagnetic solenoid. The shaft 3J is not always coupled to one end of the moving arm member 3G but may also be coupled to that of the rotary arm member 3H.

By employing such a link mechanism for linking the uptearing members 3A and the double-sided driving source, the uptearing members 3A installed on both sides of the printed circuit board 1 can be made to abut against and move away from both sides of the printed circuit board 1, respectively (the operation in the direction of arrow D). More specifically, the link mechanism is capable of driving both uptearing members 3A using one double-sided driving source without providing individual driving sources on both sides of the printed circuit board 1, respectively.

The guide members 3F, the moving arm members 3G and the rotary arm members 3H constituting the link mechanism are substantially rigid and, because the operating range of each is defined by the guide slit $3f$ and the rotary shaft $3h$, the amount of operation and operating time of the uptearing members 3A on both sides of the printed circuit board 1 are controllable equally and accurately.

Moreover, the number of parts required for the link mechanism is smaller than what is required for a coupling mechanism constituted by a rack and pinion or gear mechanism, and besides the individual member is simple in shape, so that the coupling mechanism for coupling the uptearing members 3A and the double-sided driving source are also made simple in construction.

The one end (or both ends) of each rotary shaft 3E for supporting the uptearing member with the moving arm members 3G installed thereacross is fitted with rotary arm members 3K of the uptearing member with its one end secured to the one end of the former. A slit $3k$ is provided in the other end of each rotary arm member 3K of the uptearing member and a shaft $3m$ of a coupling arm member 3M connected with the shaft 3L of a double-sided driving source is passed therethrough. That is, the rotary arm members 3K of the uptearing members are coupled through the coupling arm member 3M to the double-sided driving source 3L. As the double-sided driving source, one similar to the double-sided driving source for the link mechanism may be used.

The rotary arm members 3K of the uptearing members and the coupling arm member 3M constitute a rotary mechanism of the film uptearing devices 3 for causing the rotary arm members 3K of the uptearing members to rotate in direction of arrow H and also causing the rotary shafts 3E for supporting the uptearing members in direction of arrow I as the shaft 3L is moved in direction of arrow G. More specifically, the rotary mechanism of the uptearing members is adapted to uptearing the ends of the laminates with the uptearing members 3A by push-vibration and to move the uptearing members 3A in that state by a predetermined distance in the base carrying direction. In this embodiment, the rotary mechanism of the uptearing members operates to move the uptearing members 3A by 1~3 (mm) in the base carrying direction.

The rotary mechanism of the uptearing members thus constructed, like the link mechanism for moving the uptearing members 3A closer to and away from each other, is capable of driving the uptearing members 3A on both sides of the printed circuit board 1 using one driving source and accurately controlling the amount operation and operating time thereof.

Moreover, the rotary mechanism of the uptearing members is capable of simplifying a mechanism for coupling the uptearing members 3A and the double-sided driving source.

Each film uptearing device 3 is thus constituted mainly by the uptearing member 3A, the air-operated vibration device 3B, the link mechanism and the rotary mechanism of the uptearing members In this invention, however, electromagnetic vibration devices disclosed in the copending U.S. application Ser. No. 080,356 filed on Jul. 31, 1987, in place of the air-operated vibration devices 3B, may be used as the uptearing members 3A of the film uptearing devices 3.

Each fluid injection device 4 shown in FIGS. 1, 2 and 3 operates to send a jet of pressurized fluid such as a gas, e.g., air and inactive gas, or a liquid such as water from nozzles 4A. The fluid injection device 4 is used to directly send a fluid to the gap between the photosensitive resin layer 1C and the lifted translucent resin film at the end of the printed circuit board 1. The nozzles 4A of the fluid injection device 4 are arranged close to the uptearing member 3A of the film uptearing device 3 so that the fluid is instantly sent to that gap. There are provided a pair of nozzles (4A$_1$, 4A$_2$) adapted to sending the fluid from both sides (two directions) to the end of the uptearing member 3A of the film uptearing device 3. The fluid is supplied from one fluid supply pipe 4B to the pair of nozzles 4A.

The pair of nozzles 4A are secured through a support member 4C to the film peeler proper (fixed support member) 7. The nozzles 4A thus secured are capable of preventing the variation of the direction of fluid injection caused by minute vibrations resulting from the operation of the film peeler. That is, the nozzles 4A can ensure fluid injection in a fixed direction at all times.

Thus, a jet of fluid is sent by the fluid injection device 4 to the gap caused by the film uptearing device 3 between the photosensitive resin layer 1C and the translucent resin film 1D and the jet of fluid sent to that gap ensures that the translucent resin film 1D is easily instantly peeled off from the photosensitive resin layer 1C.

Moreover, the pair of nozzles 4A for sending the fluid from different directions ensure that the fluid is sent to part of the translucent resin film 1D thus lifted by the film uptearing device 3, whereby they boost the effect of peeling off the translucent resin film 1D by means of fluid injection.

According to the present invention, the fluid injection angle of each nozzle 4A may be set to be changeable. The fluid injection device 4 thus arranged is capable of moving the nozzles 4A as close to the aforesaid gap as possible at the time the fluid is injected and moving away from the printed circuit board 1 up to the position where the nozzles 4A are not in contact therewith after the fluid injection is completed.

Figure 5:
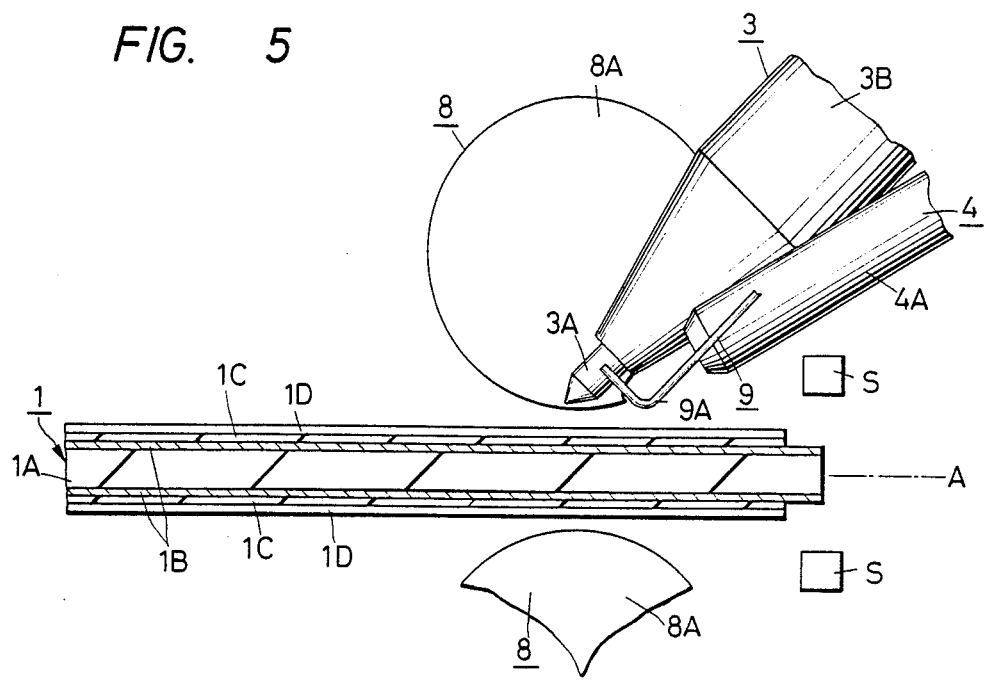
FIGS. 5 through 9 are enlarged sectional view of the principal part of FIG. 1 on a peel operation basis.

As shown in FIGS. 2, 3 and 5 (enlarged sectional view of the principal part), base holding members 8 and a laminate end detector 9 each are installed close to the base carrying pathway A—A. The base holding members 8 and the laminate end detector 9 are arranged on the same line in a direction wherein they cross the base carrying pathway A—A.

Each base holding member 8 consists of a roller 8A and a support member 8B for rotatably supporting one end of the roller 8A, the other end of the support member 8B being fitted to the film peeler proper 7 with a fitting means such as a machine screw. The base holding members 8, together with the film uptearing device 3 and the fluid injection device 4, are disposed in an area wherein the transversal space between the carrying drive rollers 2 is kept wide. Moreover, the base holding members 8 are arranged in an area wherein the energy given by the push vibration of the film uptearing device 3 and the fluid pressurized by the fluid injection device 4 is applied to the printed wiring board 1.

The roller 8A is installed a predetermined space apart from the printed wiring board 1 (actually the translucent resin film 1D on the surface thereof). More specifically, the roller 8A is set a fixed space apart to hold the printed wiring board 1 being carried within the base carrying pathway A—A and to have the translucent resin film 1D peeled off by the fluid injection device. The roller 8A is made of relatively soft material such as resin, rubber of the like to prevent the printed wiring board 1 (particularly, the photosensitive resin layer 1C of the laminate) from being damaged or broken. The support member 8B supports the roller 8A and part thereof set close to the base carrying pathway A—A is adapted to holding the printed wiring board 1 being carried within the base carrying pathway A—A as in the case of the roller 8A. The support member 8B is made of relatively hard material such as hard plastics, metal or the like.

Since the base holding member 8 is installed close to the uptearing member 3A of the film uptearing device 3 and the base carrying pathway A—A, the front end of a particularly thin printed wiring board 1 is kept from hanging down to ensure that the printed wiring board 1 is held within the base carrying pathway A—A. In other words, the base holding member 8 is intended to prevent not only trouble such as jamming during operation but also the damage or breakage of the printed wiring board 1 or the film peeler.

Moreover, as the rollers 8A are arranged in a fixed space apart from the surface of the printed wiring board 1, the translucent resin film 1D is not kept from being pressed to ensure that the translucent resin film 1D is peeled off by the fluid injection device 4.

When a thick printed wiring board 1 comes in contact with the base holding members 8, the rollers 8A or the support members 8B may have elastic properties so that the position of the base holding members 8 are made changeable.

An auxiliary base holding member 10 is installed closer to the base carrying pathway A—A on the base discharge side than the base holding members 8 are located. The auxiliary base holding member 10 consists of rollers 10A and a rotary shaft 10B fitted to the film peeler proper 7 and used to support the rollers 10A. The auxiliary base holding member 10, substantially like the base holding members 8, is adapted to holding the printed wiring board 1 within the base carrying pathway A—A.

In FIG. 5, a laminate end detector 9 is of an electrostatic capacitance or electric resistance type, wherein the former is designed for detecting changes in the electrostatic capacitance of the printed wiring board 1 and the latter for detecting changes in the electric resistance thereof. The laminate end detector 9 consists of bar contactors 9A provided on both sides of the printed wiring board 1 and respective moving support 9B. The bar contactor 9A is made of a conductive material such as copper steel. Each moving support 9B is secured to the peeler proper 7. Although the moving support 9B is not illustrated in detail but adapted to moving closer to and away from the base carrying pathway A—A (in direction of arrow J). The moving support 9B consists of, e.g., a solenoid for bringing the bar contactor 9A in contact with the base carrying pathway A-A and an elastic member for moving it away therefrom.

Referring now to FIGS. 1 through 4 and 5 through 9 (enlarged sectional views of the principal parts), a description will subsequently be given of the operations of uptearing and peeling off the end of the laminate on the printed wiring board 1.

The printed wiring board 1 in the base carrying pathway A—A is first carried by the carrying device rollers 2 in direction of arrow A.

As shown in FIG. 5, the carrying drive rollers 2 stop rotating when the front end of the printed wiring board 1 in the carrying direction passes the position where the film uptearing device 3 and the fluid injection device 4 are installed in order to stop the printed wiring board 1 from being carried. A translucent or reflective type optical sensor S for detecting the front end of the printed wiring board 1 is employed to stop the movement thereof.

Figure 6:
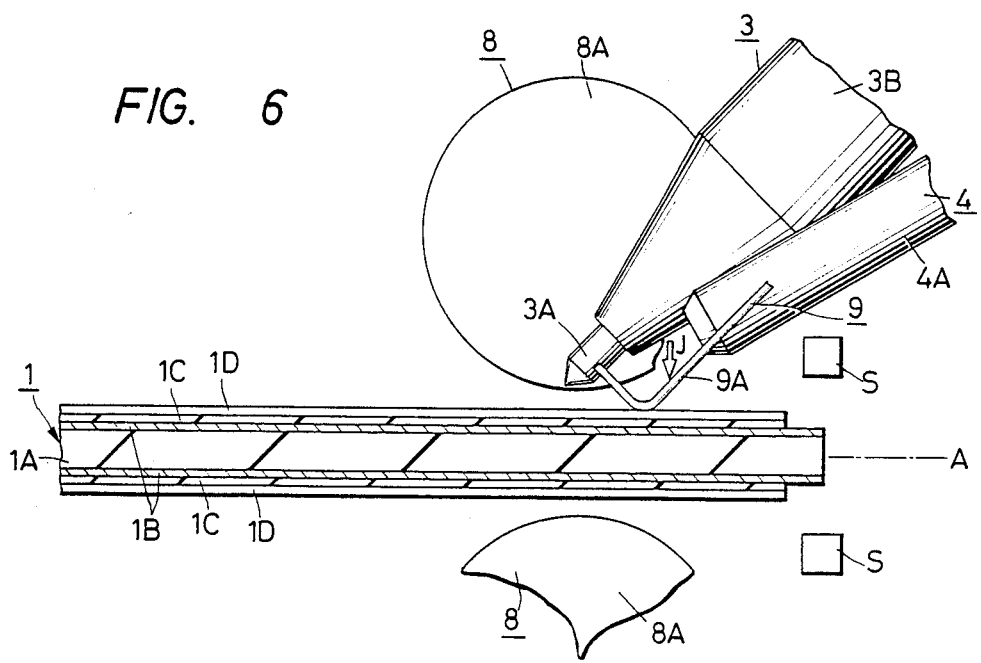

As shown in FIG. 6, the bar contactor 9A of the laminate end detector 9 comes in contact with the surface of the laminate (translucent resin film 1D) of the printed wiring board 1. The bar contactor 9A is adapted so that it is moved by the moving support 9B in direction of arrow J. As the bar contactor 9A moves, the electrostatic capacitance (or electric resistance) of the printed wiring board 1 is detected. The timing at which the bar contactor 9A contacts the surface of the laminate may be set so as to substantially match the timing at which the printed wiring board 1 is stopped by means of a detection signal from the optical sensor.

Figure 7:
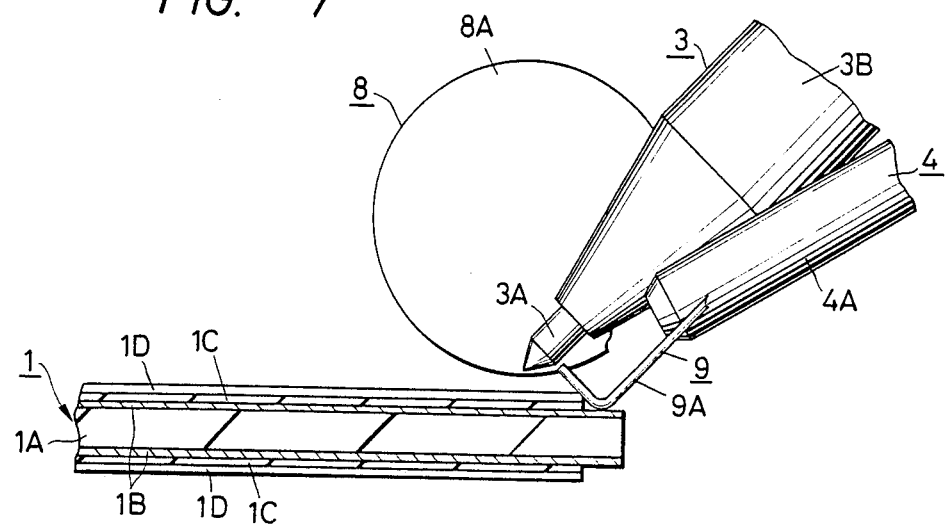
Figure 8:
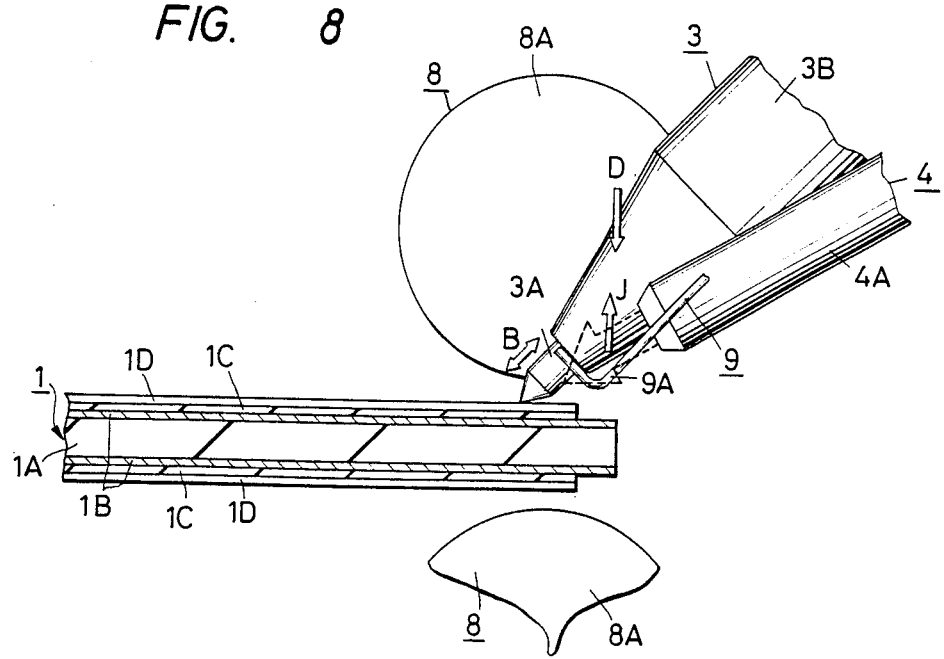

Subsequently, the printed wiring board 1 kept at a standstill is moved back while the bar contactor 9A is in contact with the surface of the laminate. As shown in FIG. 7, the electrostatic capacitance (electric resistance) changes when the bar contactor 9A reaches the front end of the laminate in the carrying direction, so that the end of the laminate is detected. When the signal for detecting the end of the laminate is sent out, the backward movement of the printed wiring board 1 is stopped. The bar contactor 9A is moved away from the base carrying pathway A—A (in direction of arrow J) at the same timing as the timing at which the backward movement thereof is stopped, whereas the uptearing member 3A of the film uptearing device 3 is caused to contact the surface of the end of the laminate while it is being vibrated. The uptearing member 3A is moved in such a manner as shown in FIG. 4 that the shaft 3J of the double-sided driving source is moved in the direction of arrow F (downward in FIG. 4), whereby the rotary arm member 3H and the moving arm member 3G are actuated to move the rotary shaft 3E for supporting the uptearing member in the direction of arrow D. That is, the uptearing member 3A is moved by the link mechanism and vibrated by the air-operated vibration device 3B. Consequently, a jet of fluid is sent from the tips of the nozzles 4A of the fluid injection device 4 at the same timing as the timing at which the uptearing member 3A is push-vibrated.

Figure 9:
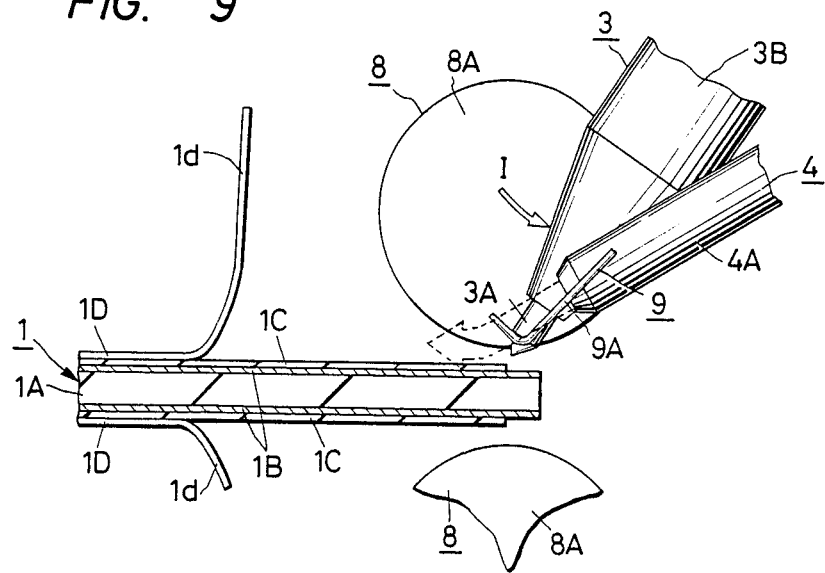

As shown in FIG. 9, subsequently, the uptearing member 3A is slightly moved in the direction in which the base is carried (in the direction of arrow I) while the uptearing member 3A is being vibrated. The movement of the uptearing member 3A is implemented by moving the shaft 3L of the double-sided drive source in direction of arrow G (to the right in FIG. 9), rotating the rotary mechanism of the uptearing member consisting of the rotary arm member 3K of the uptearing member and the coupling arm member 3M thereby, and rotating the rotary shaft 3E for supporting the uptearing member in direction of arrow I. The minute movement of the uptearing member 3A is carried out at, e.g., a stroke of 1~3 (mm).

The printed wiring board 1 is held between the carrying drive rollers 2 and base press rollers (pinch rollers) 2A respectively provided on the former to keep the position of the printed wiring board 1 from changing when the uptearing members 3A push-vibrate and slightly move. That is, a signal is produced when the front end of the printed wiring board 1 is detected and the motor rotating to drive the carrying drive rollers 2 is stopped thereby. Each air cylinder simultaneously operates to actuate a brake mechanism, causing each brake press plate to abut against and press the base press roller 2A to ensure that the printed wiring board 1 is held therebetween.

The end of the laminate consisting of the photosensitive resin layer 1C and the translucent resin film of the printed wiring board 1 is push-vibrated by the uptearing member 3A of the film uptearing device 3 to uptear the translucent resin film 1D from the photosensitive resin layer 1C. The jet of fluid is sent by the fluid injection device 4 to the gap produced in the interface therebetween to peel off the translucent resin film 1D on the front side thereof (i.e., uptearing the translucent resin film 1d).

The uptearing of the end of the translucent resin film 1D is implemented by the uptearing member 3A simply constructed of the needle.

Moreover, since the film uptearing device 3 and the fluid injection device 4 each are provided on the base carrying pathway A—A of the printed wiring board 1, the end of the translucent resin film 1D can be uptorn and peeled off therefrom automatically.

In consideration of the fact that the laminate may be formed distortedly by thermocompression bonding on the printed wiring board 1, the film uptearing device 3 and the fluid injection device 4 may be such a combination as to have a plurality of uptearing members 3A and nozzles 4A in the direction across the (width) direction wherein the printed wiring board 1 is carried.

Although the uptearing member 3A of the film uptearing device 3 is provided in the direction across the (width) direction wherein the printed wiring board 1 is carried according to this embodiment, the uptearing member 3A according to the present invention may be installed close to the end or corner of the laminate in the same direction as that wherein the printed wiring board 1 is carried. In this case, the nozzles 4A of the fluid injection device 4 are provided close to the uptearing member 3A.

Although the uptearing member 3A of the film uptearing device 3 is operated by the link mechanism in this embodiment, it may be operated by a rack/pinion mechanism according to the present invention.

The uptearing member 3A of the film uptearing device 3 may also be constructed of an adhesive member such as an adhesive roller.

Figure 10:
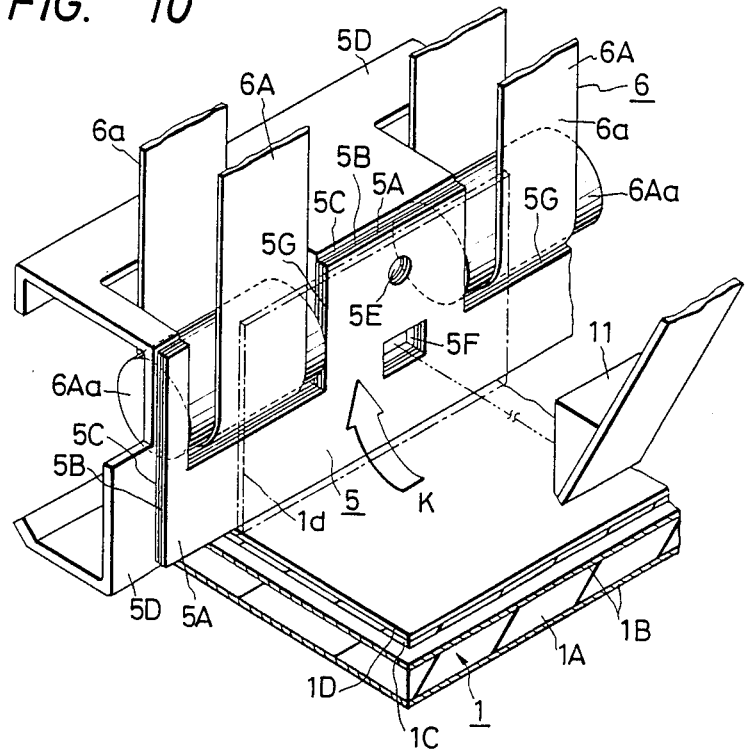
FIG. 10 is a perspective view of the principal part of FIG. 1.

The front side translucent resin film 1d thus peeled off by the fluid injection device 4 in the direction wherein the base is carried is, as shown in FIGS. 1, 2 and 10 (perspective view of the principal part) caused by the fluid pressure to adhere to the peel direction setting plate (auxiliary peeling plate) 5. The peel direction setting plate 5 is used to set the peel direction of the translucent resin film 1d thus peeled off toward a film carrying device 6 and also adapted to assisting the operation of peeling off the translucent resin film 1D sticking to the photosensitive resin layer 1C on the printed wiring board 1. The translucent resin film 1d thus peeled off is indicated by an alternate long and short dash line in FIGS. 2 and 10.

The face to which the peel direction setting plate 5 is stuck (the face to which the translucent resin film 1d is stuck) is not limited to what is shown thereby and it is arranged that the translucent resin film 1D sticking to the printed wiring board 1 forms a substantially right angle with the translucent resin film 1d thus uptorn.

The front end (peeling position) on the peel side of the peel direction setting plate 5 is in an arcuate form having a small curvature radius to prevent the photosensitive resin layer 1C from being damaged or broken, the curvature radius being set at, e.g., 3 mm or less.

The peel direction setting plate 5 is set apart from the translucent resin film 1D sticking to the printed wiring board 1 to the extent that it may not rub on the translucent resin film 1D in order that the photosensitive resin layer 1C is prevented from being broken or damaged while the printed wiring board 1 is being carried or while the translucent resin film 1D being carried is peeled off. The front end of the peel direction setting plate 5 is made to adhere to the translucent resin film 1D while the end of the laminate is uptorn and peeled off and to hold the printed wiring board 1. In other words, the peel direction setting plate 5 is moved closer and away from the base carrying pathway A—A and further used to hold the printed wiring board 1 with its bottom surface when it is moved closer thereto. The peel direction setting plate 5 is made to contact or move away from the printed wiring board 1 interlockingly with the operation of, e.g., a braking press plate (not shown) (operated by an air cylinder) for pressing the base press roller 2A. That is, it is possible to arrange the structure so that the peel direction setting plate 5 may hold the printed wiring board 1 simultaneously while holding the printed wiring board 1 with the base press roller 2A.

The fluid jetted out of the nozzles 4A of the fluid injection device 4 is thus kept from blowing across the back side of the peel direction setting plate 5 by allowing the peel direction setting plate 5 to move closer to and away from the base carrying pathway A—A, so that the translucent resin film 1D is effectively peeled off. Simultaneously, the translucent resin film 1d is caused to firmly adhere to peel direction setting plate 5 and a carrying belt (6).

Moreover, the peel direction setting plate 5 has a predetermined length in the peel direction so as to cover the width of the printed wiring board carrying pathway A—A or substantially the whole area defined by the fluid injection width.

The peel direction setting plate 5 thus constructed contributes to preventing the fluid from blowing therethrough as shown by an arrow K in FIG. 10 and to improving the peeling effect of the translucent resin film 1D. At the same time, the translucent resin film 1d is made to more firmly adhere to the peel direction setting plate 5 and the carrying belt (6).

As detailedly shown in FIG. 10, a conductive member 5A is provided on the face of the peel direction setting plate 5 to which the film clings (the face to which the translucent resin film directly adheres). The conductive member 5A is provided on an insulating member 5B. The conductive member 5A is bonded through the insulating member 5B and a conductive member 5C to a setting plate support member 5D constructed with the U-shaped peel direction setting plate 5.

The conductive members 5A and 5C are made a metal plate of, e.g., copper or stainless steel whose electric resistance is extremely small. The insulating member 5B is also in the form of a plate, whereas the setting plate support member 5D is made of, e.g., a metal such as stainless steel. That is, the conductive member 5A is maintained in an electrically floating state.

The peel direction setting plate 5 onto which the film adheres thus consists of the conductive member 5A and the insulating member (insulating material) 5B bearing the conductive member 5A thereon, whereby when the translucent resin film 1d charged at the time it is peeled off from the printed wiring board 1 attaches to the conductive member 5A, the Coulomb force because of its electrostatic capacitance acting thereon accelerates the adhesion of the translucent resin film 1d further to ensure that the conductive member 5A has the translucent resin film 1d adhere to the peel direction setting plate 5.

Since it is only necessary to provide the conductive member 5A in an electrically floating state, the setting plate support member 5D of the peel direction setting plate 5 may be made of an insulating material such as resin. The conductive member 5A may be directly provided on the surface onto which the film is attached. The conductive member 5A functions similarly to a capacitor.

On the face of the peel direction setting plate 5 where the film adheres are provided the conductive member 5A, the insulating, member 5B, the conductive member 5C and a film absorbing hole 5E passed through the setting plate support member 5D. An absorption pipe from an absorption device (vacuum absorption device) (not shown) is connected to the film absorbing hole 5E and adapted to absorb the translucent resin film 1d thus peeled off the face. One or a plurality of film absorbing holes 5E are bored in the film absorbing face.

The film absorbing hole 5E is thus provided in the film absorbing face of the film peeling direction setting plate 5 and the film absorbing hole 5E is made to communicate with the absorbing device and thereby the translucent resin film 1d is absorbed and held on the film absorbing face so as to increase the adhesion of the translucent resin film 1d; that is, the film absorbing hole 5E and the absorbing device ensure that the translucent resin film 1d is absorbed onto the film absorbing face of the film peel direction setting plate 5.

The absorbing device or an absorbing pipe connecting that device to the film absorbing hole 5E may be fitted with an absorbing pressure detector for detecting the absorbing pressure to make it known whether the translucent resin film 1d is absorbed onto the film absorbing face of the film peel direction setting plate 5; that is, the film peeler may be equipped with a detector for detecting the whether the film has been peeled off. The absorbing pressure detector outputs a detection signal indicating that the translucent resin film 1d has been absorbed onto the film absorbing face when the absorbing pressure is high or otherwise outputs an opposite detection signal. The plurality of film absorbing holes should preferably be provided in the film absorbing face of the film peel direction setting plate 5 to increase accuracy for detecting the peeled-off state of the film. If the absorption of the translucent resin film 1d on the film absorbing face is not detected by the detector for detecting the peeled-off state of the film, the printed wiring board 1 (whose film has not been peeled off yet) will be removed from the base carrying pathway A—A.

Moreover, a hole 5F for detecting the peeled-off state of the film is bored through the film absorbing face of the film peel direction setting plate 5 in the same manner as that of the film absorbing hole 5E. The hole 5F for detecting the peeled-off state of the film is used to pass the light radiated from the optical sensor 11 to detect whether the translucent resin film 1d has stuck onto the peel direction setting plate 5 and to detect the peeled-off state of the film; that is, the light reflected from the translucent resin film 1d covering the hole for detecting the peeled-off state of the film is detected by the optical sensor 11. When the attachment of the translucent resin film 1d onto the film absorbing face is not confirmed through the hole 5F for detecting the peeled-off state of the film and by the optical sensor 11, the printed wiring board 1 (whose film has not been peeled off yet) is removed from the base carrying pathway A—A as described above. As the optical sensor 11, a reflective (or transmissive) one is, as shown in FIG. 3, is fitted to the film peeler proper 7.

The film peel direction setting plate 5 thus constructed is used to stabilize the peel position of the translucent resin film 1D and to apply a uniform peel force to the translucent resin film 1D. Accordingly, the film peel direction setting plate 5 prevents the positional fluctuation of the translucent resin film 1D being peeled off, the deflection of peel stress, and the damage or breakage of the photosensitive resin layer 1C.

The film absorbing face of the film peel direction setting plate 5 may be such that the translucent resin film 1D forms an obtuse angle with the direction wherein the translucent resin film 1d thus peeled off, depending on the material quality of the translucent resin film 1D, the fluid pressure of the fluid injection device 4 or the carrying speed of the printed wiring board 1. The angle of the film absorbing face of the film peel direction setting plate 5 may be set to be changeable by means of the driving source such as an air cylinder. Moreover, the positions and angles of the fixed and moving carrying belts of the film carrying device 6 may also be made changeable as the angle of the film peel direction setting plate 5 changes.

According to the present invention, a plurality of grooves extended in a direction crossing the base carrying direction or a direction wherein the translucent resin film 1d is peeled off may be provided in the film absorbing face of the film peel direction setting plate 5 and the plurality of holes 5E for absorbing the film may be provided in the film absorbing face and the groove bottoms, whereas the holes 5E for absorbing the film are made to communicate with the absorbing device, respectively. The film peel direction setting plate 5 thus constructed is capable of surely absorbing the translucent resin film 1d on the film absorbing face and, when the film is fed into (discharged from) the film carrying device 6, the translucent resin film can instantly be peeled off from the film absorbing face to ensure that the translucent resin film 1d is carried by the film carrying device 6.

Figure 11:
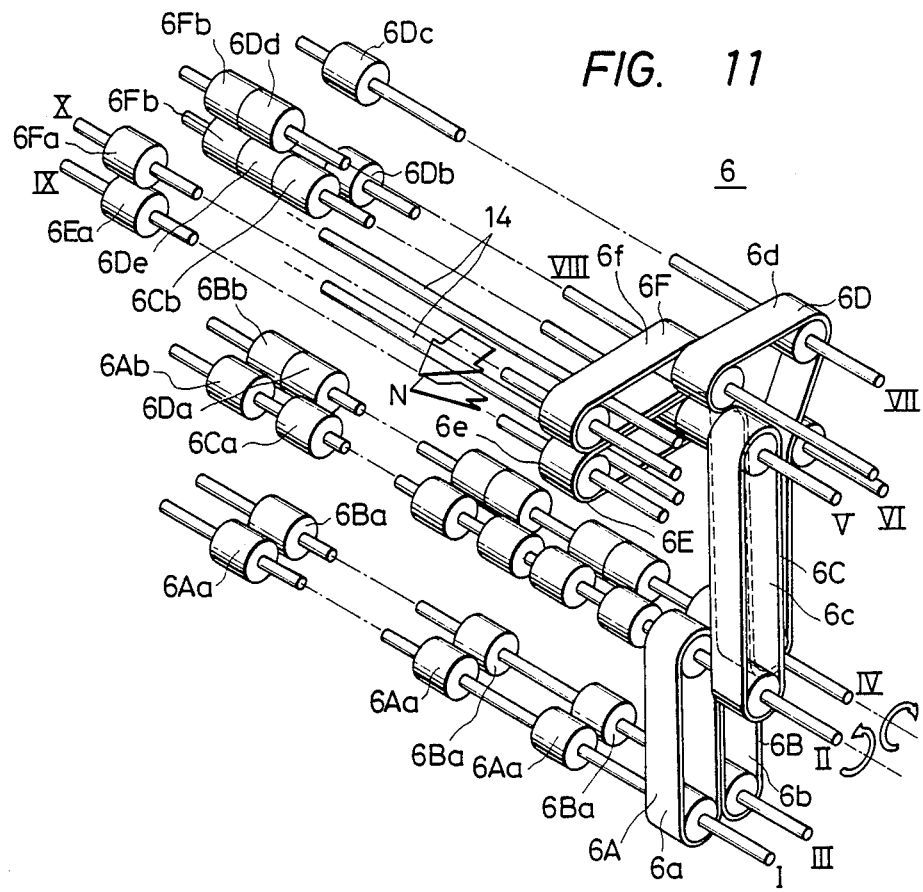
FIG. 11 is a diffused perspective view of FIG. 1.

The translucent resin film 1d caused by the fluid injection device 4 to stick to the film absorbing face of the film peel direction setting plate 5 is carried while it is being peeled off by the film carrying (discharging) device 6 as shown in FIGS. 1, 2 and 11 (enlarged perspective view). At this time, the film peel direction setting plate 5 defines the peel position of the translucent resin film 1D and is also adapted to assisting the peeling of the translucent resin film 1D.

The film carrying device 6 mainly consists of upper and lower carrying belt mechanisms installed on both sides of the printed wiring board 1 (base carrying pathway A—A), respectively.

The upper carrying belt mechanism, as shown in FIG. 11 in detail, consists of fixed carrying belts 6A, 6C, 6D, 6E, 6F and a moving carrying belt 6B.

The fixed carrying belt 6A consists of rollers 6Aa supported by a driven shaft I, rollers 6Ab supported by a driving shaft II and a belt 6a wound on the rollers 6Aa and 6Ab.

The moving carrying belt 6B consists of rollers 6Ba supported by a driven shaft III, rollers 6Bb supported by a driving shaft IV and a belt 6b wound on the rollers 6Ba and 6Bb. The moving carrying belt 6B is adapted to rotating on the driving shaft IV in direction of arrow L as shown in FIG. 2. The moving carrying belt 6B makes the translucent resin film 1d thus peeled off readily stick to the film peel direction setting plate 5 and can hold and carry the translucent resin film 1d with the fixed carrying belt 6A. The fixed and moving carrying belts 6A, 6B hold the film therebetween through a cut 5G provided in the film peel direction setting plate 5 as shown in FIG. 10. The cut 5G is used to have the fixed and moving carrying belts 6A, 6B hold the translucent resin film 1d therebetween when both the belts reach that film whose peel position and direction have been set by the film peel direction setting plate 5; that is, the cut 5G helps the translucent resin film 1d to be surely held between the fixed and moving carrying belts 6A, 6B.

The fixed carrying belt 6C consists of rollers 6Ca supported by the driving shaft II, rollers 6Cb supported by a driven shaft V and a belt 6c wound on the rollers 6Ca, 6Cb.

The fixed carrying belt 6D consists of rollers 6Da supported by a driven shaft IV, rollers 6Db supported by a driven shaft VI, rollers supported by a driven shaft VII, rollers 6Db supported by a driven shaft VIII, rollers 6De supported by the driven shaft V and a belt 6d wound on the rollers 6Da–6De.

The fixed carrying belts 6C, 6D are adapted to carrying the translucent resin film 1d carried by the fixed and moving carrying belts 6A, 6B further in the discharge direction. The fixed carrying belt 6D and the rollers 6De are installed because the translucent resin film 1d changes its direction wherein it is carried from the fixed carrying belts 6C, 6D to the others 6E, 6F; that is, the roller 6De is capable of making equal the curvature radii of the belts 6c, 6d brought in contact with the translucent resin film 1d when the carrying direction of the film changes. Consequently, the translucent resin film 1d being carried is prevented from producing wrinkles or having trouble such as jamming therein.

There is installed the fixed carrying belt 6D (or 6C) contacting the other side of the translucent resin film 1d in between the plurality of fixed carrying belts 6C (or 6D) brought in contact with one side of the translucent resin film and provided at fixed intervals in the direction wherein the translucent resin film 1d is carried. In other words, the fixed carrying belts 6C, 6D are so arranged in a transversely zigzag manner as to see whether the surfaces (those in contact with the translucent resin film 1d) of the belts 6c, 6d coincide or tightly engage with each other.

The fixed carrying belts 6C, 6D thus arranged in a zigzag manner are capable of providing the translucent film 1d being carried with transversal tension to ensure that the fixed carrying belts 6C, 6D are caused to uniformly hold the translucent resin film 1d therebetween.

Moreover, the translucent resin film 1d thus sandwiched between the fixed carrying belts 6C, 6D is carried in such a manner as to envelope the surface or the side of each belt 6c or 6d, so that the rollers 6Ca, 6Cb or 6Da~6De are prevented from axially shifting from the belt 6c or 6d. Consequently, the force of holding the translucent resin film 1d being carried is made uniform to prevent wrinkles from being developed and thus any trouble such as jamming from occurring. The film peeler according to the present invention is equipped with an upper container 7A for accommodating peeled-off films and effective in forming such fixed carrying belts 6C, 6D as the upper carrying belt mechanism of the film carrying pathway is made longer than that of the lower carrying belt mechanism.

The fixed carrying belt 6E consists of rollers 6Ea supported by a driven shaft IX, rollers 6Eb supported by the driven shaft V and a belt wound on the rollers 6Ea, 6Eb.

The fixed carrying belt 6F consists of rollers 6Fa supported by a driven shaft X, rollers 6Fb supported by a driven shaft VIII and a belt wound on the rollers 6Fa, 6Fb.

The lower carrying belt mechanism, as shown in FIGS. 1, 2, consists of a fixed carrying belt 6G and a moving carrying belt 6H.

The fixed carrying belt 6G consists of rollers 6Ga, 6Gb respectively supported by different driven shafts (not shown), rollers 6Gc supported by a driving shaft (not shown) and a belt 6g wound on the rollers 6Gs~6Gc.

The moving carrying belt 6H consists consists of rollers 6Ha, 6Hb respectively supported by different driven shafts (not shown), rollers 6Hc supported by a driving shaft (not shown) and a belt wound on the rollers 6Ha 6Hc. The moving carrying belt 6H is adapted to rotating in direction of arrow L as in the case of the moving carrying belt 6B.

The aforesaid belts 6a~6h are composed of toothed rubber belts and each of the rollers 6Aa, 6Ab, 6Ba, 6Bb, ... rollers 6Ha, 6Hb, 6Hc, except the rollers 6De, 6Db, is composed of a toothed pulley to ensure that the carrying belts can be traveled. The rollers 6De, 6Db have smooth surfaces. In place of the toothed rubber belts and pulleys the belts 6a~6h may be those which are large rubber belts having rough frictional surfaces whereas the rollers 6Aa~6Hc each may have rough surfaces provided with netted knurled patterns.

Figure 12:
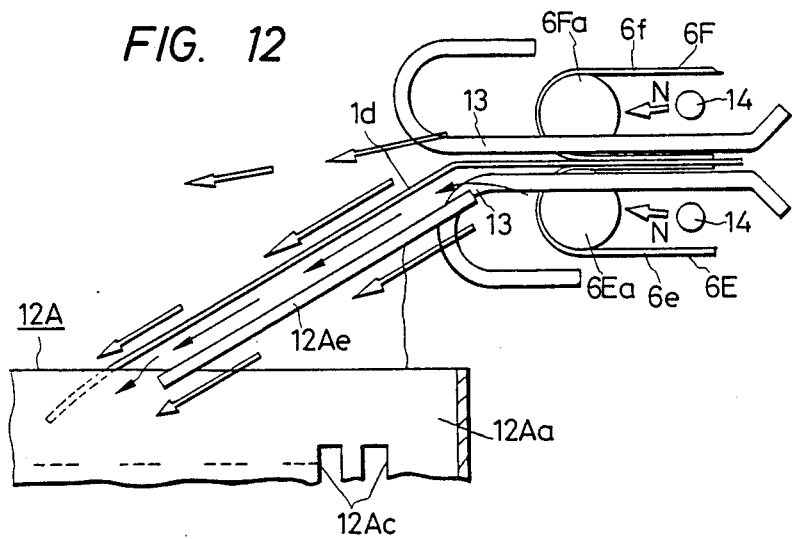
FIG. 12 is an enlarged sectional view of the principal part of FIG. 1.

As shown in FIGS. 1, 2. the fixed carrying belts 6E, 6F of the upper carrying belt mechanism are adapted to carrying the translucent resin film 1d carried by the fixed carrying belts 6C, 6D from the film peeler proper in direction of arrow M. The translucent resin film 1d discharged from the discharge portions of the fixed carrying belts 6E, 6F of the film peeler proper 7 is, as shown in FIGS. 1, 2, 12 (enlarged sectional view of the principal part) and 13 (enlarged perspective view of the principal part), discharged into an upper container 12A for containing the film thus discharged. The discharge of the translucent resin film 1d is carried out via a film entanglement preventive member 13 provided between the discharge portions of the fixed carrying belts 6E, 6F and the upper container 12A for containing the film discharged.

The fixed and moving carrying belts 6G, 6H of the lower carrying belt mechanism, like the upper carrying belt mechanism, is used to peel off and carry another translucent resin film 1d whose peel position and direction have been set by the film peel direction setting plate 5 and then to discharge the translucent resin film 1d from the film peeler 7 in direction of arrow 0. The translucent resin film 1d discharged from the film peeler proper 7 is discharged into a lower container 12B for containing the film thus discharged. The discharge of the translucent resin film 1d is carried out via a film entanglement preventive member 13 provided between the fixed carrying belts 6G, 6H and the lower container for containing the film discharged.

As shown in FIGS. 1, 2, 11, 12, a fluid injection mechanism 14 for sending a jet of fluid in the discharge direction (of arrow N) of the translucent resin film 1d is installed close to the film carrying pathway of the respective fixed and moving carrying belts 6E, 6F, 6G, 6H. The fluid injection mechanism 14 is adapted to surely guiding the translucent resin film 1d in the discharge direction. The fluid injection mechanism 14 consists of a pipe having outlets for the fluid between the fixed and moving carrying belts 6E, 6F, 6G, 6H. As the fluid, a gas such as pressurized air or inactive gas is used. Otherwise, a liquid such as water may be used. In addition, a deelectrifying device (not shown) for reducing electricity which the translucent resin film 1d is charged with during the film peel operation is installed close to the fluid injection mechanism 14.

The fluid injection mechanism 14 is provided close to each of the discharge portions of fixed and moving carrying belts 6E, 6F, 6G, 6H to prevent the translucent resin film 1d from being rewound on each of the fixed and moving carrying belts 6E, 6F, 6G. 6H and to guide the translucent resin film 1d with the fluid in direction of M or O, so that the translucent resin film 1d is effectively discharged into the upper or lower container 12A or 12B for containing the film thus discharged.

As shown in FIG. 2, a deelectrifying device 15 and an ion diffusion device 16 are respectively installed close to the fixed and moving carrying belts 6A, 6H. The deelectrifying device 15 discharges ions to reduce the electricity the translucent resin film 1d is charged with during the peel or carrying operation. The ion diffusion device 16 is used to diffuse the ions discharged from the deelectrifying device 15 and to efficiently reduce the electricity the translucent resin film 1d is charged with. The ion diffusion device 16 is adapted to, for instance, diffusing ions with pressurized air or the like.

The film entanglement preventive device 13 is installed close to each of the discharge portions between the fixed and moving carrying belts 6E, 6F, 6G, 6H and secured to the film peeler proper 7. The film entanglement preventive device 13 is composed of a J-, U- or I-shaped long, narrow member protruded from each discharge portion (film peeler proper 7) and of, e.g., metal such as steel.

The film entanglement preventive device 13 thus constructed is able to lead the translucent resin film 1d from each of the discharge portions of the fixed and moving carrying belts 6E, 6F, 6G, 6H in the discharge direction (in direction of M or O), so that the translucent resin film 1d is prevented from being rewound on each of the fixed and moving carrying belts 6E, 6F, 6G, 6H. In other words, the film entanglement preventive device 13 is used to prevent any trouble such as jamming in the film carrying pathway of the film carrying device 6.

Figure 13:
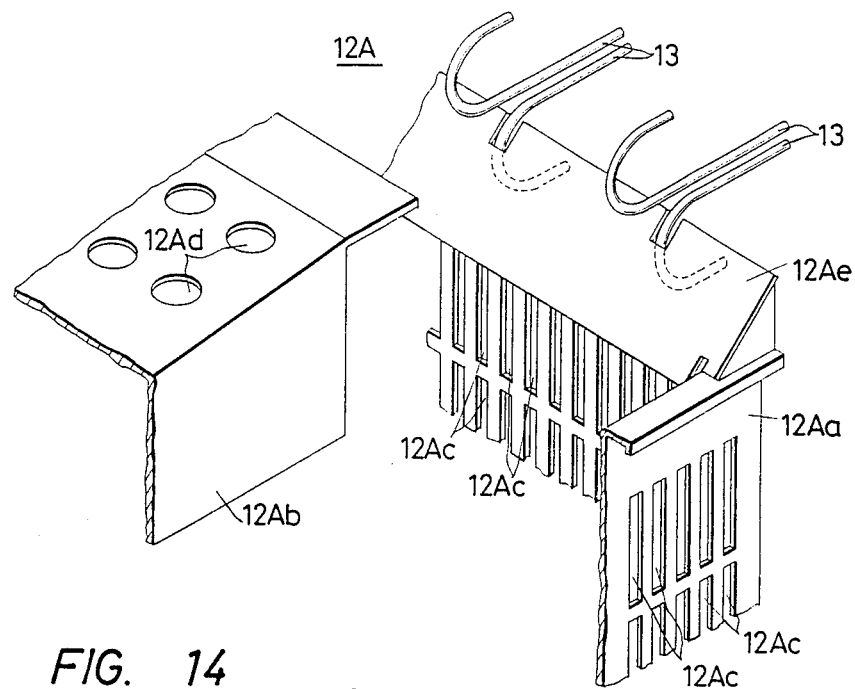
FIG. 13 is an enlarged perspective view of the principal part of FIG. 1.
Figure 14:
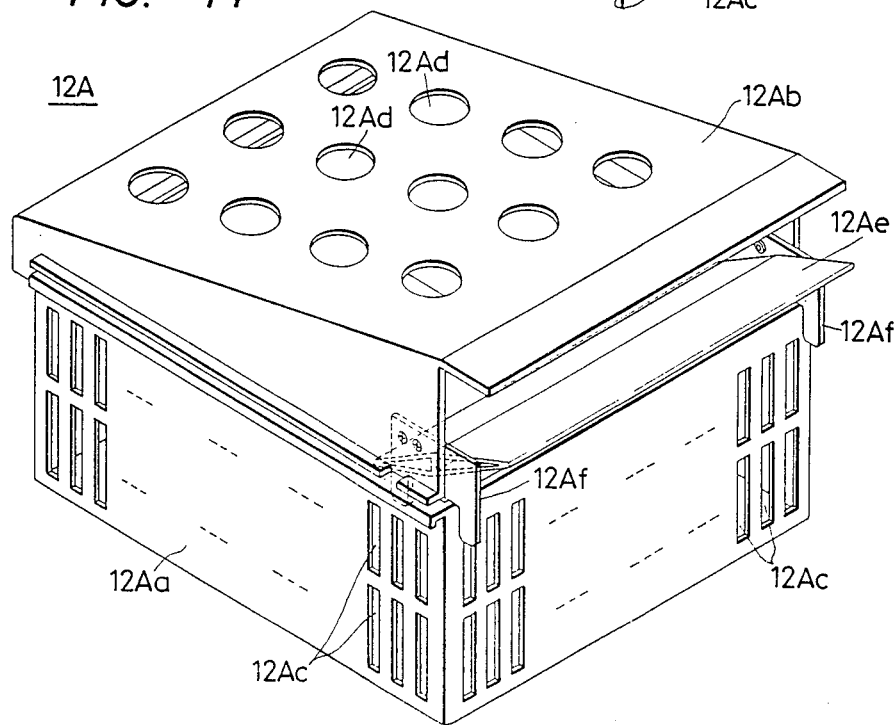
FIG. 14 is a perspective view of the principal part of another film peeler embodying the present invention.

The upper container 12A for containing the film discharged is, as shown in FIGS. 1, 13 and 14, detachably fitted to the film peeler 7 close to the film discharge portions of the fixed carrying belts 6E, 6F. The upper container 12A is installed above the lower container 12B for containing the film discharged and contributes to making smaller the area occupied by the film peeler proper 7 and thus compact the peeler proper itself. The upper container 12A for containing the film discharged consists of a container 12Aa for containing the translucent resin film 1d discharged and a cover member 12Ab for covering the upper part. The container 12Aa for containing the film and the cover member 12Ab each are composed of light metal such as aluminum alloy, resin or wood. A plurality of rectangular holes 12Ac for extracting air (contained in the container 12Aa for containing the film) remaining in the lower part of the translucent resin film 1d being discharged are provided in the side of the container 12Aa for containing the film. The cover member 12Ab, like the container 12Aa for containing the film, is also provided with holes 12Ad for extracting air.

The upper container 12A for containing the film is equipped with a guide member 12Ae fitted to the container 12Aa for containing the film close to the film discharge portions of the fixed carrying belts 6E, 6F of the film peeler proper. The guide member 12Ae is in the form of a plate and made of, e.g., metal such as copper or stainless, wood or synthetic resin. The guide member 12Ae is used to couple the container 12Aa of the upper container for containing the film discharged to the film entanglement preventive member 13; that is, the guide member 12Ae is used to guide the translucent resin film 1d discharged from the fixed carrying belts 6E, 6F to the film entanglement preventive member 13 and further to the container 12Aa for containing the film. In the course of guiding the translucent resin film 1d to the upper container 12A for containing the film, it is guided by the fluid from the fluid injection mechanism 14. In other words, the translucent resin film 1d is carried while being supported by the fluid flowing across the guide member 12Ae, so that it is discharged into the container 12A for containing the film without contacting the guide member 12Ae. Moreover, part of the fluid injected from the fluid injection mechanism 14 is caused to flow along the lower side of the guide member 12Ae and join the fluid passed along the upper side of the guide member 12Ae after it has passed the guide member 12Ae and then flow in the same direction, whereby the translucent resin film 1d guided by the fluid is brought to the bottom of the container 12A for containing the film discharged one by one in an extended state.

Since the upper container 12A for containing the film is thus equipped with the guide member 12Ae, the translucent resin films 1d are prevented from accumulating within the container 12A for containing the film discharged (container 12Aa for containing the film) right under the discharge portions of the fixed carrying belts 6E, 6F. Accordingly, the wasted space is minimized and at the same time the translucent resin film 1d can be discharged in the upper container 12A for containing the film efficiently. The guide member 12Ae is particularly effective because the upper container 12A for containing the film is constructed to transversely discharge the translucent resin film 1d.

Moreover, the film entanglement preventive member 13 held between the fixed carrying belts 6E, 6F contributes to preventing the translucent resin film 1d from being rewound and, while smoothly guiding the translucent resin film 1d, efficiently discharging it into the upper container 12A therefor.

The guide member 12Ae may be fitted to the film peeler close to the discharge portions of the fixed carrying belts 6E, 6F according to the present invention. As shown in FIG. 14 (perspective view of the principal portion), the guide member 12Ae may also be fitted to the cover member 12Ab of the upper container 12A for containing the film. The guide member 12Ae is composed of a member having a flat face (similar to a wing section). The central portion of the guide member 12Ae is provided with a crossbeam (shown without mark) for reinforcing purposes. The guide member 12Ae is secured through a guide member support 12Af to the cover member 12Ab with fitting means such as an adhesive agent or machine screw.

Figure 15:
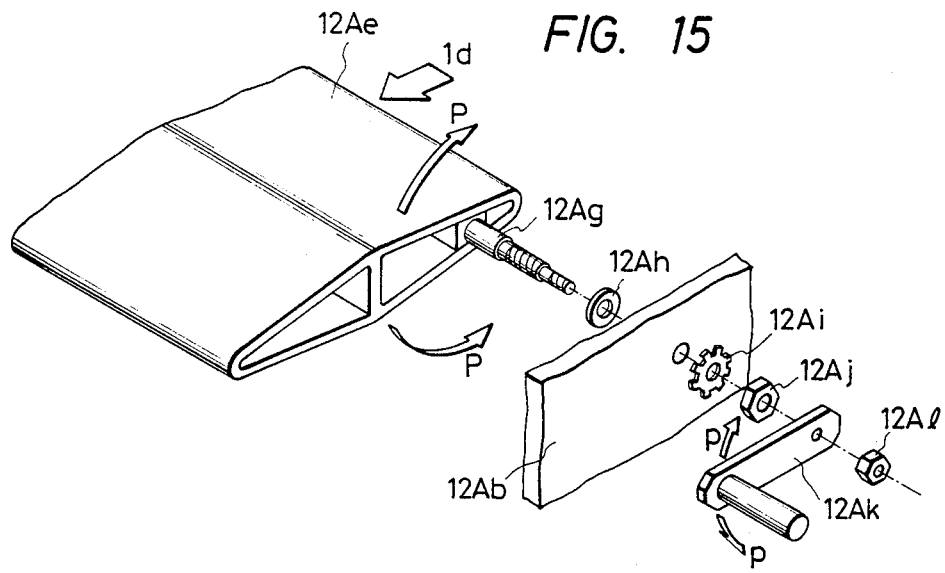
FIG. 15 is an enlarged perspective view of the principal part of another film peeler embodying the present invention.

As shown in FIG. 15 (enlarged exploded perspective view of the principal part) the guide member 12Ae can be made rotatable in direction of arrow P; that is, the guide member 12Ae is so arranged as to change the angle at which the translucent resin film 1d is discharged from the fixed carrying belts 6E. 6F. The guide member 12Ae can be fixed at a predetermined angle by tightening a variable angle shaft 12Ag protruding from the side of the guide member 12Ae to the cover member 12Ab with a washer 12Ah, a spring washer 12Ai and a tie nut 12Aj. Furthermore, that angle of the guide member 12Ae can be made changeable in direction of arrow P by loosening the tie nut 12Aj and turning a handle 12Ak fixed to the variable angle shaft 12Ag with a fixing nut 12Al.

The angle of the guide member 12Ae is thus made changeable so that the translucent resin films 1d in the optimum extended state can be piled up on the bottom of the container 12A for containing the film.

Figure 16:
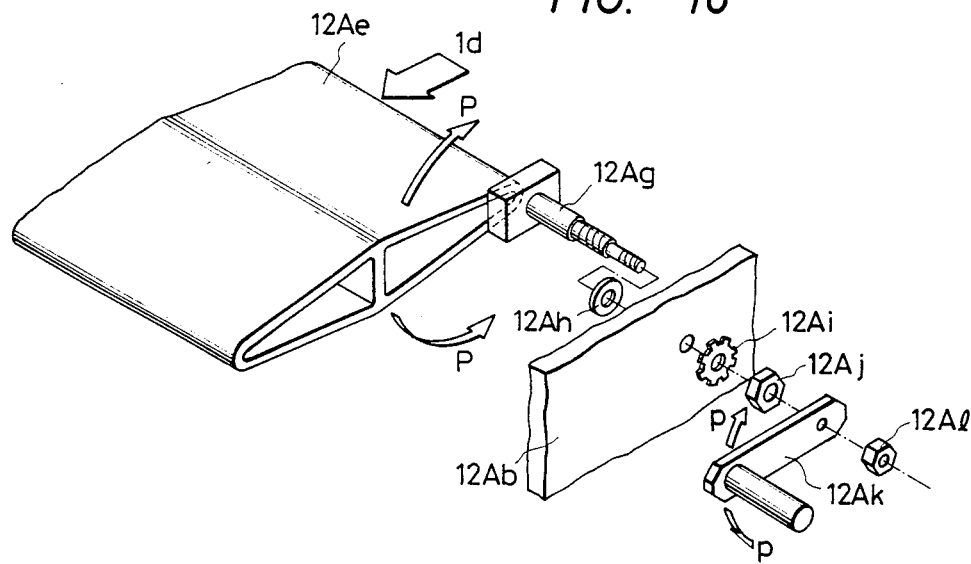
FIG. 16 is an enlarged perspective view of the principal part of still another film peeler embodying the present invention.

As shown in FIG. 16 (enlarged exploded view of the principal part), moreover, the variable angle shaft 12Ag of the guide member 12Ae is fitted to the front end closer to the discharge portions of the fixed carrying belts 6E, 6F rather than the position where the variable angle shaft 12Ag shown in FIG. 15; that is, the variable angle shaft 12Ag is so arranged as to make the position of the front end of the guide member 12Ae unchangeable even when the angle of the guide member 12Ae changes. In other words, the guide member 12Ae thus adapted is capable of always stabilize the flow of the fluid for guiding the translucent resin film 1d being discharged.

Although not shown, the angle of the guide member 12Ae may also be set changeable automatically, depending on the number of translucent resin films being accumulated in the upper container 12A for containing the film.

The lower container 12B for containing the film discharged is detachably fitted to the film peeler proper 7 close to the discharge portions of the fixed and moving carrying belts 6G, 6H. The lower container 12B for containing the film discharged has a plurality of holes 12Ba for extracting air provided in its side as in the case of the upper container 12A therefor. The lower container 12B for containing the film discharged is so constructed as to discharge the translucent resin film 1d upwardly to ensure that the translucent resin film 1d is smoothly discharged and therefore no guide member 12Ae is required.

It will be understood that the present invention is needless to say not limited to the aforesaid embodiments and that the foregoing and other changes in form and details can be made therein without departing from the spirit and scope of the invention.

The needle-like uptearing member 3A of the film uptearing device 3 may be replaced with, e.g., what is in the form of a wedge, flat plate or the like.

The present invention is also applicable to a film peeler having a film uptearing device for uptearing the end of the translucent resin film 1D with a brush having a plurality of needles on the circumference of a rotary body.

The present invention is further applicable to a film peeler having a film uptearing device for uptearing the end portion of the translucent resin film 1D and used to peel off the film by having an adhesive member pressed against the portion thus uptorn.

The present invention is still further applicable to a film peeler for peeling off a cover film sticking to a constructional decorative laminated sheet.

As set forth above, the following effects are achievable according to the present invention:

The film peeler for peeling off the film sticking to the base according to the present invention comprises the film uptearing device having the uptearing member for uptearing one end of the film and installed close to the base carrying pathway, and the base holding members for holding the base within the base carrying pathway, the base holding members being installed close to the uptearing member. Accordingly, the front end of the base, a base which is particularly thin, is prevented from hanging down by its own weight while being carried to ensure that it is held within the base carrying pathway.

Moreover, since the base is surely held within the base carrying pathway, the base being carried is prevented from jamming therein and therefore the film peeler as well as the base is kept from being damaged or broken.

Figure 17:
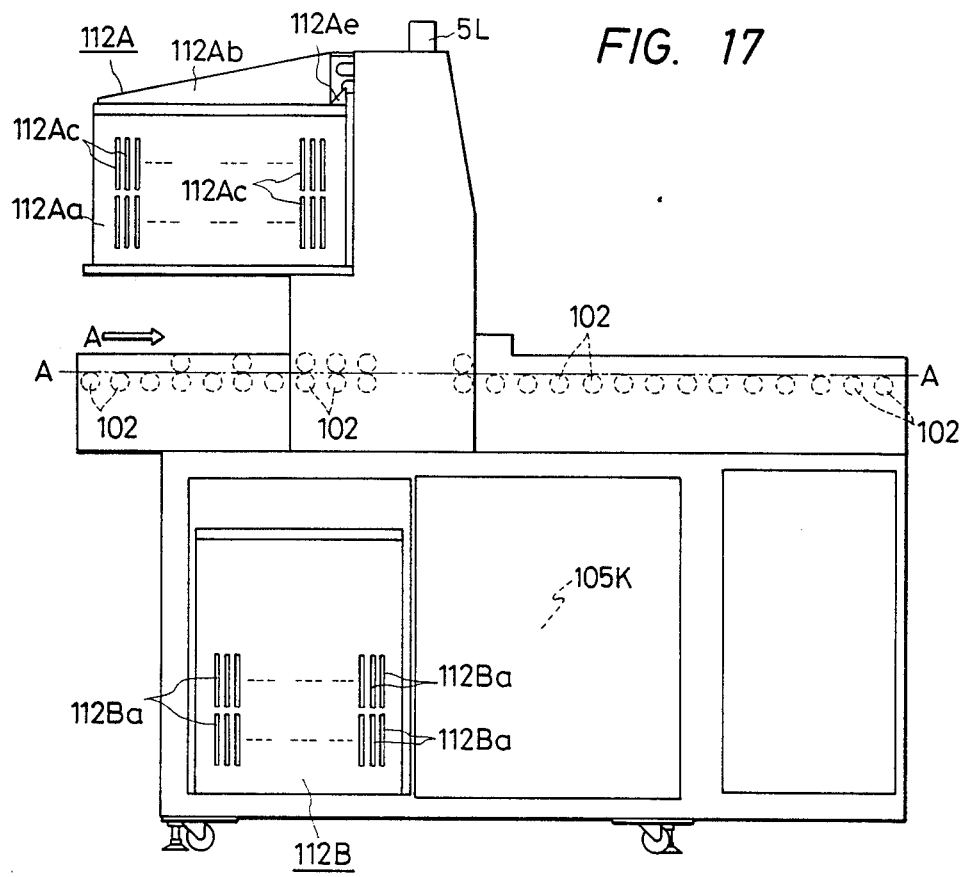
FIGS. 17 and 18 show another embodiment of the invention.
Figure 19:
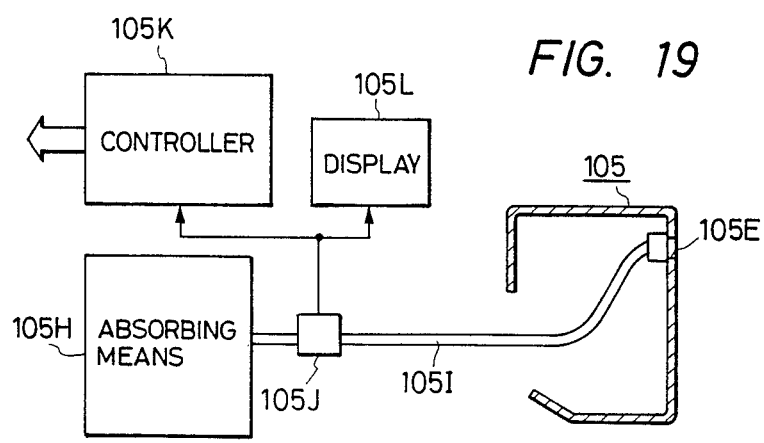
FIG. 19 is a block diagram of a device for detecting the peeled-off state of the film.
Figure 18:
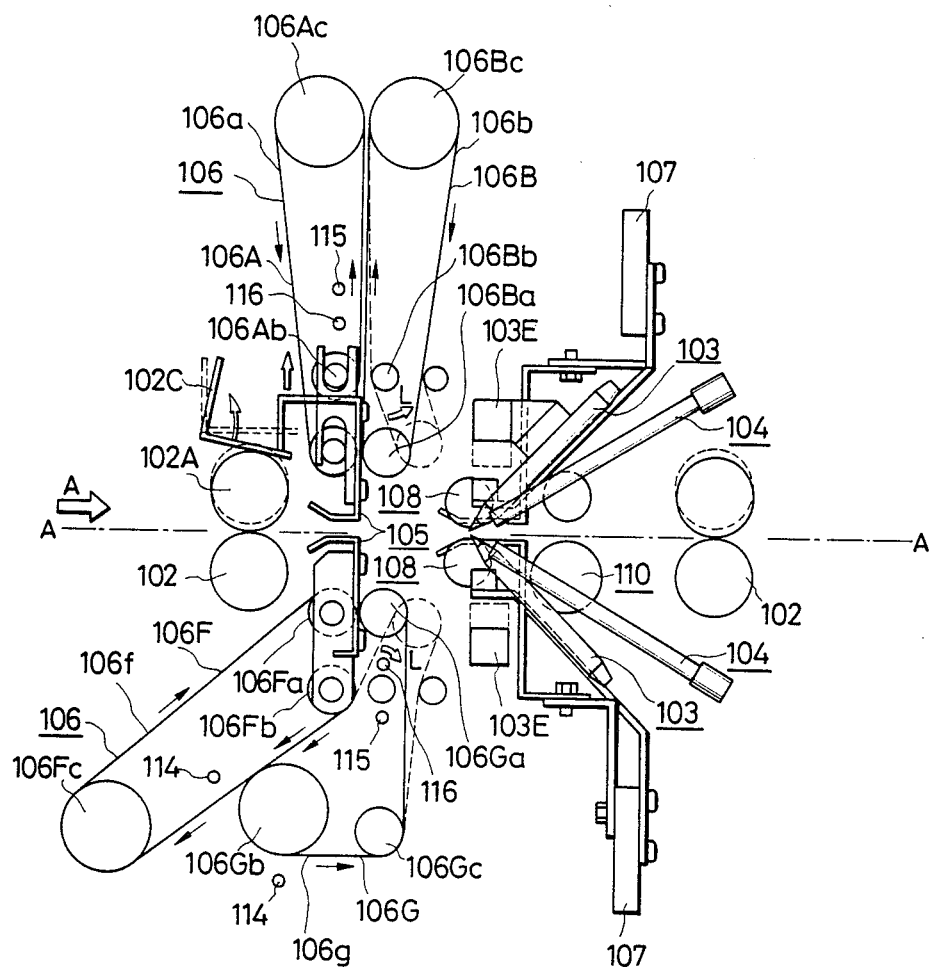

FIGS. 17 to 21 show a modification according to the present invention. In FIGS. 17 to 19 (block diagram), an absorbing pipe 105I with one end connected to an absorbing device (vacuum absorbing device) 105H is connected to a film absorbing hole 105E. The sucking force from the absorbing device 105H acts through the absorbing pipe 105I on the film absorbing hole 105E so as to positively absorb the cover film to the face of the peel direction setting plate 105 where the film is held. One or a plurality of film absorbing holes 105E are provided in the film adhering face to increase the cover film sucking and holding force.

The film absorbing holes 105E are provided in the film adhering face of the peel direction setting plate and coupled to the absorbing device 105H to ensure that the cover film 101d is caused to adhere and held onto the film adhering face. The cover film 101d is thus surely held between the carrying belts of a rilm carrying device as described later, so that the cover film 1D sticking to the printed wiring board 1 is discharged while being peeled off; that is, the film absorbing holes 105E and the absorbing device 5H prevent the production of a defective base whose cover film 1D has not been peeled off, though it has been subjected to the film peeling process.

As shown in FIG. 19, the pathway connecting the film absorbing holes 105E and the absorbing device 105H, i.e., the predetermined portion of the absorbing pipe 105I is fitted with an absorbing pressure detector 105J for detecting the absorbing pressure (air pressure). The absorbing pressure detector 105J is not limited to this type of a device and, e.g., a diaphragm or bellows type elastic device may be used. The absorbing pressure detector 105J is used to detect whether or not the cover film 1d thus peeled off has adhered to the face of the peel direction setting plate 105; that is, to detect the peeled-off state. The absorbing pressure detector 105J outputs a detection signal designating that the cover film 1d has surely adhered to the film adhering face when the absorbing pressure is high or otherwise it outputs an opposite detection signal. These detection signals are converted into electric signals by an air-operated or differential transformer and sent to a control circuit 105K or display unit 105L. The detection signal may be supplied by a link mechanism to the control circuit 105K or display unit 105L mechanically. The absorbing pressure detector 105J and the control circuit 105K or display unit 105L constitute a device for detecting the peeled-off state of the film. As shown in FIG. 17, the control circuit 105K is disposed in the central portion of the film peeler proper. The display unit 105L is, as shown in FIG. 17, located in the upper portion of the film peeler proper, so that it is readily confirmed by the operator.

On receiving the output signal from the absorbing pressure detector, the control circuit 105K operates to control the rotation of the carrying drive rollers 102 and the peeling operation. When the control circuit 105K receives, from the absorbing pressure detector 105J, e.g., the detection signal designating that the cover film 1d has not been peeled off, the control circuit 105K stops the operation of the film carrying device 106 and has the carrying drive rollers 102 carry the defective base with the film unpeeled up to a predetermined position where the base is dischargeable. More specifically, the control circuit 105K operates so as to remove the defective base from the base carrying pathway A—A and to prevent it from being carried to a developing device at the following stage.

The display unit 105L is formed with, e.g., a sound generator such as a buzzer or a light generator such as a lamp. The display unit 105L, like the control device 105K, provides the operator with necessary information to have the defective base with the film unpeeled removed from the base carrying pathway A—A and to prevent it from being carried to the developing device at the next stage.

In order to increase accuracy with which the peeled-off state of the cover film 1d, a plurality of film absorbing holes 105E are provided on the film adhering holes 105E are provided on the film adhering face of the peel direction setting plate 105 and each of the film absorbing holes 105E should preferably be equipped with the device for detecting the peeled-off state of the film.

The device for detecting the peeled-off state of the film is installed between the film absorbing hole 105E and the absorbing device 105H to make it possible to detect whether or not the cover film 1d has been peeled off and the defective base with the film unpeeled. Consequently, the defective base can be removed from the base carrying pathway A—A and prevented from being carried to the developing device at the next stage. Since the defective base with the film unpeeled becomes reusable, yields related to the production of printed wiring boards 1 can be improved.

Figure 20:
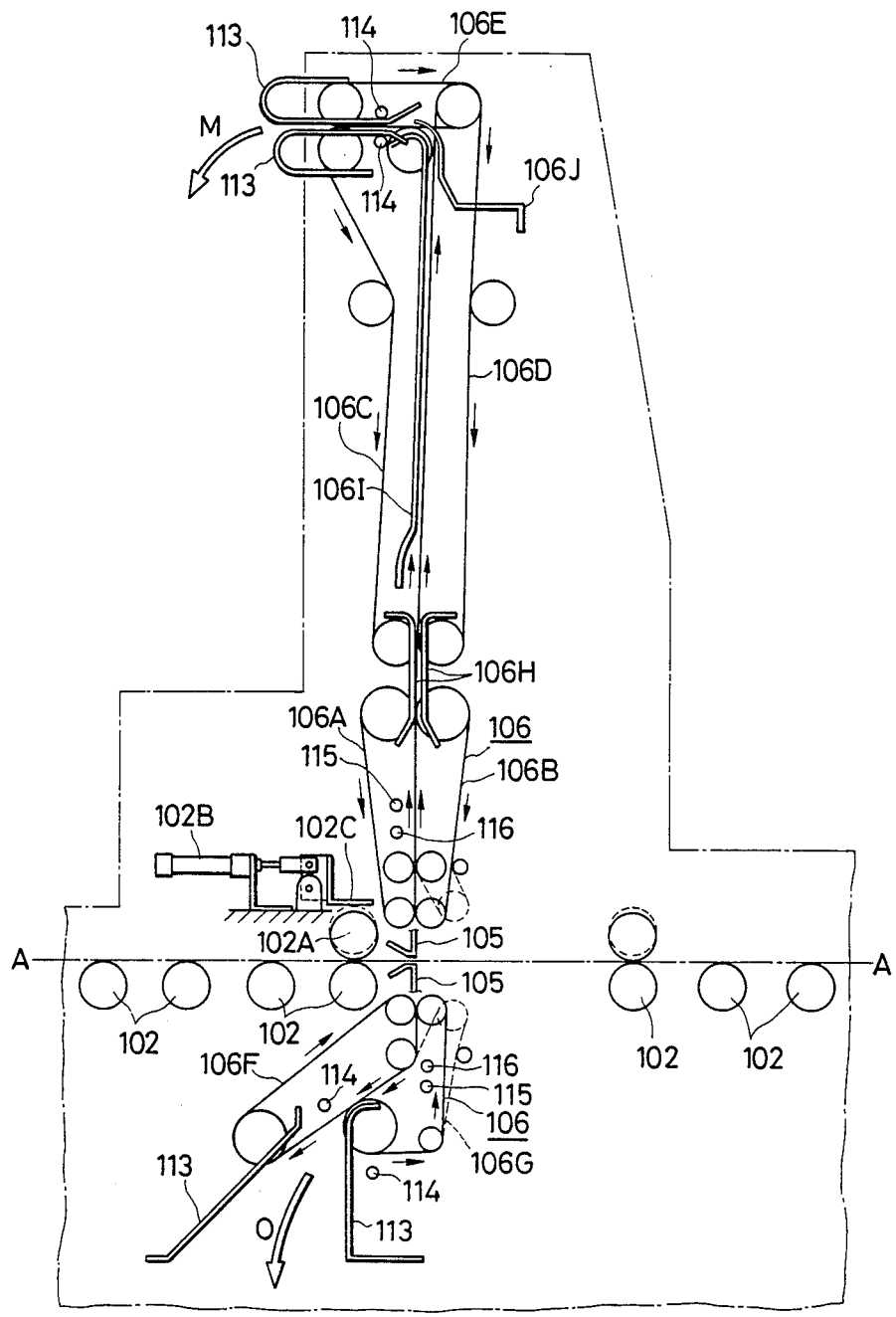
FIG. 20 is a perspective view of the principal part of FIG. 17.
Figure 21:
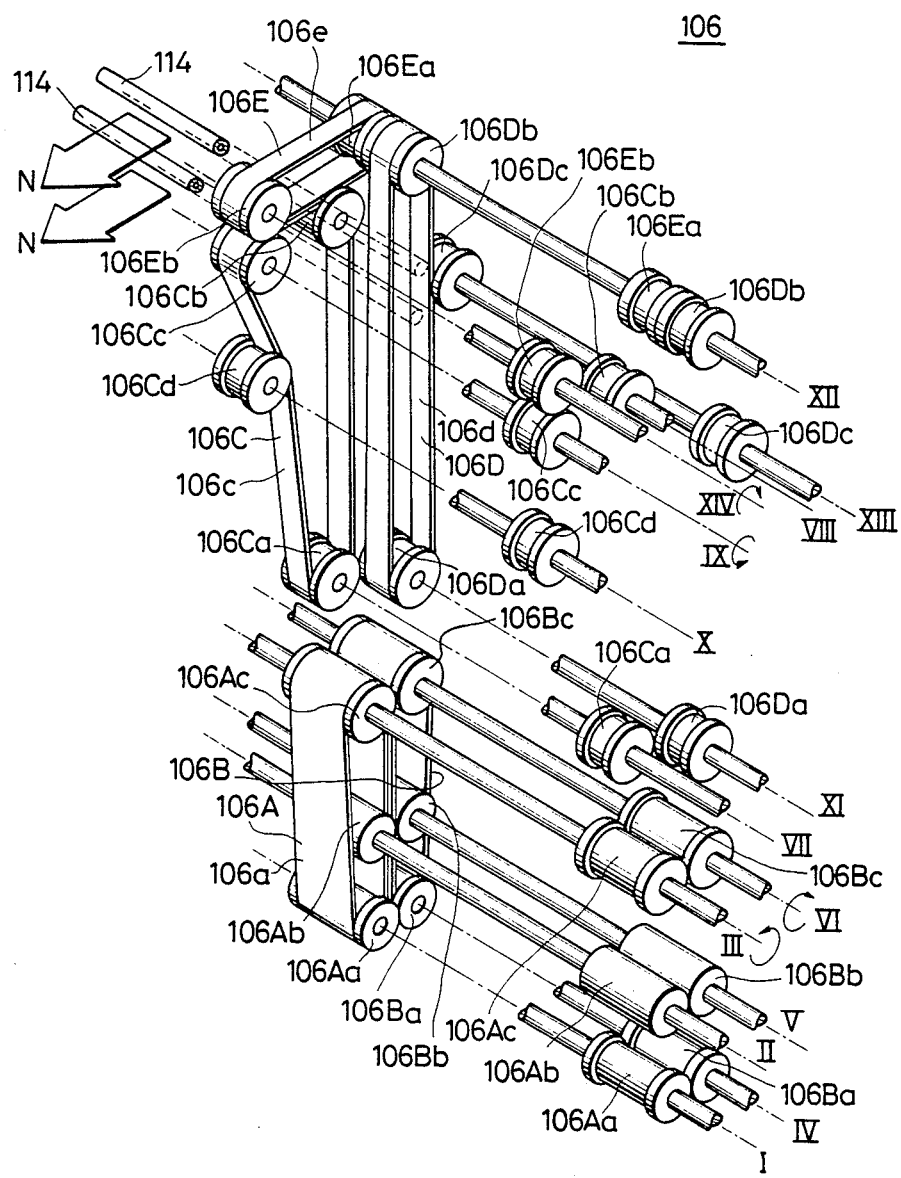
FIG. 21 is an enlarged perspective view of FIG. 17.

As shown in detailed FIGS. 20 and 21, an upper carrying belt mechanism consists of fixed and moving carrying belts 106A, 106C, 106D, 106E, 106B.

The fixed carrying belt 106A consists of a roller 106Aa supported by a driven shaft I, a roller 106Ab supported by a driven shaft II, a roller 106Ac supported by a drive shaft III, and a belt 106a wound on the rollers 106Aa, 106Ab, 106Ac.

The moving carrying belt 106B consists of a roller 106Ba supported by a driven shaft IV, a roller 106Bb supported by a driven shaft V, a roller 106Bc supported by a drive shaft VI, and a belt 106b wound on the rollers 106Ba, 106Bb, 106Bc. The moving carrying belt 106B is, as shown in FIGS. 18 and 20 adapted to rotating the roller 106Ba on the drive shaft V in direction of arrow L.

The fixed carrying belt 106C consists of a roller 106Ca supported by a driven shaft VII, a roller 106Cb supported by a driven shaft VIII, a roller 106Cc supported by a drive shaft IX, a roller 6Cd supported by a driven shaft X, and a belt 106c wound on the rollers 106Ca, 106Cb, 106Cc, 106Cd. The roller 106Cd is adapted to providing tension for the belt 106c.

The fixed carrying belt 106D consists of a roller 106Da supported by a driven shaft XI, a roller 106Db supported by a driven shaft XII, a roller 106 Dc supported by a driven shaft XIII, and a belt 106D wound on the rollers 106Da, 106Db, 106Dc. The roller 106Dc is adapted to providing tension for the belt 106d.

The fixed carrying belt 106E consists of a roller 106Ea supported by a driven shaft XII, a roller 106Eb supported by a driven shaft XIV, and a belt 106e wound on the rollers 106Ea, 106Eb.

A lower carrying belt mechanism consists, as shown in FIGS. 18, 20, fixed and moving carrying belts 106F, 106G.

The fixed carrying belt 106F consists of rollers 106Fa, 106Fb supported by different driven shafts (not shown), a roller 106Fc supported by a drive shaft (not shown), and a belt 106f wound on the rollers 106Fa~106Fc.

The moving carrying belt 106G consists of rollers 106Ga, 106Gc supported by different driven shafts (not shown), a roller 106Gb supported by a driven shaft (not shown), and a belt 106g wound on the rollers 106Ga~106Gc. The moving carrying belt 106G, like the moving carrying belt 106B, is adapted to rotating in direction of arrow L.

The upper carrying belt mechanism is such that a peeled film guide member 106H is installed between the fixed and moving carrying belts 106A, 106B and fixed and moving belts 106C, 106D. A peeled film guide member 106I is installed between the fixed carrying belts 106C, 106D. Further, a peeled film guide member 106J is installed between the fixed carrying belts 106C, 106D across the fixed carrying belt 106E. Each of the peeled film guide members 106H–106J is made of wire- (or bar-like) or plate-like metal or resin. Each of the peeled film guide members 106H–106J is adapted to carrying the cover film 1d smoothly without jamming in the discharge direction of the upper carrying mechanism.

The film peeler for peeling off a film sticking to a base by peeling off part of the film sticking to the base, making that part of the film thus peeled off adhere to a peel direction setting plate and discharging the film with a film carrying device according to the present invention is so constructed that the face of the peel direction setting plate where the film adheres is formed with a conductive member and that the conductive member is provided on an insulating material. Accordingly, the Coulomb force resulting from the electrostatic capacitance acts on the face of the peel direction setting plate where a film adheres and on the film peeled off from the base to ensure that the film is held on the peel direction setting plate. The film sticking to the base can reliably be peeled off and therefore the production of defective bases is prevented.

The film peeler constructed as described above is further characterized in that film attaching holes passed through the conductive member and the peel direction setting plate are provided and that the attaching device for attaching the film peeled off from the base is coupled to the film attaching holes. Accordingly, the sucking force for attaching the film to the attaching face of the film peel direction setting plate acts through the film attaching holes to ensure that the film is held on the peel direction setting plate.

The film peeler constructed as described above is further characterized in that the detector for detecting the peeled-off state of the film by means of the attaching pressure of the attaching device is provided in the pathway connecting the film absorbing holes and the attaching device. Accordingly, changes in the attaching pressure in the pathway between the film attaching holes and the attaching device are detected to check whether or not the film has been peeled off.

Incidentally in the modification, as shown in FIG. 19, during the suspension of the rotation of the driving source, an air-operated cylinder (or hydraulic cylinder) 102B (see FIG. 20) acts to operate a brake mechanism, causing an L-shaped braking press plate 102C to abut against and press the base press roller 102A, whereby the printed wiring board 1 is fixedly held.

What is claimed is:

1. A film peeler for peeling off a film sticking to a base, comprising:
   a film uptearing device installed close to a base carrying pathway having an uptearing member for uptearing one end of said film; and
   base holding members installed close to said uptearing member for holding said base within the base carrying pathway, said base holding members having elastic properties so that the position thereof can be changed when said holding members contact said base.

2. A film peeler as claimed in claim 1, wherein said base holding members are installed a predetermined space apart from the surface of said film sticking to said base.

3. A film peeler as claimed in claim 1, wherein said base holding members are such that its portions contacting said base are composed of rotatable rollers.

4. A film peeler as claimed in claim 3, wherein said uptearing member is adapted to give energy in the form of vibration, pressure, etc. to the end of said film to tear up part of said film from said base.

5. A film peeler as claimed in claim 3, wherein said uptearing member is constructed of an adhesive member for uptearing the end of said film from said base.

6. A film peeler for peeling off a film sticking to a base, comprising:
   a peel direction setting plate for peeling off part of said film sticking to said base;

a first layer of said plate made of an insulating material;

a second outer layer of said plate located on said first layer and formed from a conductive material causing the peeled off film to adhere to said plate; and film carrying means for discharging said peeled film.

7. A film peeler as claimed in claim 6, wherein said conductive material is made of a metal such as copper, stainless steel or the like.

8. A film peeler as claimed in claim 7, wherein said peel direction setting plate is used to set the peel direction of said film to aid in the peeling off of said film from said base.

9. A film peeler as claimed in claim 8, wherein said peel direction setting plate causes said film to peel off at substantially a right angle to the direction in which said base is carried.

10. A film peeler as claimed in claim 6, further comprising means for attaching said peeled-off film through the use of attaching holes which pass through said plate.

11. A film peeler as claimed in claim 10, further comprising means for detecting whether or not said film has been peeled off by using the attaching pressure in the pathway between said attaching holes and said attaching device.

12. A film peeler as claimed in claim 10, wherein one or a plurality of said film attaching holes are provided.

13. A film peeler for peeling off a film sticking to a base, comprising:

a peel direction setting plate for peeling off part of said film sticking to said base;

at least one film attaching hole which passes through said plate;

attaching means connected to said hole for attaching the film peeled away from the base; and film carrying means for discharging said peeled film.

14. A film peeler as claimed in claim 13, wherein said peel direction setting plate has a single film attaching hole.

15. A film peeler as claimed in claim 13, wherein said peel direction setting plate has a plurality of film attaching holes.

16. A film peeler as claimed in claim 13, further comprising means for detecting whether or not said film has been peeled off according to an attaching pressure in a connecting path between said hole and said attaching means.

17. A film peeler for peeling off a film sticking to a base, further including:

carrying belt means for transferring the peeled film to a film discharging receiving container;

a film discharging section of said carrying belt means which uses a jet of fluid to guide the film; and means for guiding the film into said film discharging receiving container;

wherein the jet of fluid and the guide means are provided near the film discharging section and/or in the film discharging receiving container.

18. A film peeler for peeling off a film sticking to a base, further including:

carrying belt means for transferring the peeled film to a film discharging receiving container;

a film discharging section of said carrying belt means which uses a jet of fluid to guide the film;

means for preventing any entrainment of the film which extends in a film discharge direction from the carrying belt means near the film discharging section; and means to guide the film into the film discharging receiving container which uses the film entrainment preventing means and is provided along with the jet of fluid near said discharging section and/or in the film discharging receiving container.

19. A film peeler as claimed in claim 17, wherein said guide means includes a plate-like member.

20. A film peeler as claimed in claim 17, wherein said guide means includes a member having a planar surface.

21. A film peeler as claimed in claim 17, wherein said guide means includes a member made of wood.

22. A film peeler as claimed in claim 17, wherein said guide means includes a member made of synthetic resin.

23. A film peeler as claimed in claim 17, wherein said guide means includes a member made of metal.

24. A film peeler as claimed in claim 17, wherein said guide means includes a member whose guide direction is changeable.

25. A film peeler as claimed in claim 17, wherein said film discharging receiving container has an air vent hole through which air contained in the container may be discharged to the outside.

26. A film peeler as claimed in claim 17, wherein said film discharging receiving container is composed of a film receiving receptacle and a cover, and said guide means is provided in said film receiving receptacle.

27. A film peeler as claimed in claim 26, wherein said film receiving receptacle has an air vent hole and said cover has an air vent hole.

28. A film peeler as claimed in claim 18, wherein said film entrainment preventing member is composed of a rod-like member.

* * * * *